(12) United States Patent
Cheng et al.

(10) Patent No.: US 9,773,870 B1
(45) Date of Patent: Sep. 26, 2017

(54) STRAINED SEMICONDUCTOR DEVICE

(71) Applicant: INTERNATIONAL BUSINESS MACHINES CORPORATION, Armonk, NY (US)

(72) Inventors: Kangguo Cheng, Schenectady, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/195,251

(22) Filed: Jun. 28, 2016

(51) Int. Cl.
| H01L 21/02 | (2006.01) |
| H01L 21/332 | (2006.01) |
| H01L 29/10 | (2006.01) |
| H01L 21/8238 | (2006.01) |
| H01L 27/092 | (2006.01) |

(52) U.S. Cl.
CPC .. *H01L 29/1054* (2013.01); *H01L 21/823807* (2013.01); *H01L 21/823821* (2013.01); *H01L 27/0924* (2013.01)

(58) Field of Classification Search
USPC ........ 438/136, 137, 455–458, 149–165, 173, 438/192, 206, 212, 424, 427, 428, 591
See application file for complete search history.

(56) References Cited

U.S. PATENT DOCUMENTS

| 6,762,448 B1 | 7/2004 | Lin et al. |
| 6,794,256 B1 | 9/2004 | Fuselier et al. |
| 7,198,995 B2 | 4/2007 | Chidambarrao et al. |
| 7,611,980 B2 | 11/2009 | Wells et al. |
| 8,354,331 B2 | 1/2013 | Cheng et al. |
| 8,841,178 B1 | 9/2014 | Basker et al. |
| 8,901,615 B2 | 12/2014 | Moroz |
| 8,951,870 B2 | 2/2015 | Basker et al. |
| 9,093,533 B2 | 7/2015 | Cheng et al. |
| 9,196,479 B1 | 11/2015 | Cheng et al. |
| 2006/0019462 A1* | 1/2006 | Cheng ............... H01L 21/82341 438/400 |

* cited by examiner

*Primary Examiner* — Julio J Maldonado
*Assistant Examiner* — Moin Rahman
(74) *Attorney, Agent, or Firm* — Cantor Colburn LLP; Vazken Alexanian

(57) ABSTRACT

A semiconductor device comprises a first semiconductor fin having a first width, the first semiconductor fin is arranged on a first portion of the strain relaxation buffer layer, where the first portion of the strain relaxation buffer layer has a second width and a second semiconductor fin having a width substantially similar to the first width, the second semiconductor fin is arranged on a second portion of the strain relaxation buffer layer, where the second portion of the strain relaxation buffer layer has a third width. A gate stack is arranged over a channel region of the first fin and a channel region of the second fin.

9 Claims, 34 Drawing Sheets

STRAINED SEMICONDUCTOR DEVICE

BACKGROUND

The present invention generally relates to complimentary metal-oxide semiconductors (CMOS) and metal-oxide-semiconductor field-effect transistors (MOSFET), and more specifically, to forming strained fins in semiconductor devices.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET, with n-doped source and drain junctions, uses electrons as the current carriers. The pFET, with p-doped source and drain junctions, uses holes as the current carriers.

Strain engineering is used to induce strain on the channel region of nFET and pFET devices. The strain may include a tensile strain or a compressive strain on the channel regions depending on the characteristics of the device. Crystalline materials such as crystalline silicon (c-Si) and crystalline silicon germanium (c-SiGe) are orientated in a lattice structure each with a different lattice constant (lattice parameter). Typically, during an epitaxial growth process where a seed layer has a lattice constant that is different from the grown material layer, a strain is induced in the grown material layer. For example, when silicon is grown on a relaxed silicon germanium layer a tensile strain is induced in the grown silicon layer.

The finFET is a type of MOSFET. The finFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Since the fin provides a three dimensional surface for the channel region, a larger channel length may be achieved in a given region of the substrate as opposed to a planar FET device.

Gate spacers form an insulating film along the gate sidewalls. Gate spacers may also initially be formed along sacrificial gate sidewalls in replacement gate technology. The gate spacers are used to define source/drain regions in active areas of a semiconductor substrate located adjacent to the gate.

Device scaling drives the semiconductor industry, which reduces costs, decreases power consumption, and provides faster devices with increased functions per unit area. Improvements in optical lithography have played a major role in device scaling. However, optical lithography has limitations for minimum dimensions and pitch, which are determined by the wavelength of the irradiation of the lithographic process.

SUMMARY

According to an embodiment of the present invention, a method for forming a semiconductor device comprises forming a strain relaxation buffer layer on a substrate, a tensile strained layer on a first portion of the strain relaxation buffer layer and a compressive strained layer on a second portion of the strain relaxation buffer layer. A pad layer is formed on the tensile strained layer and the compressive strained layer and a layer of semiconductor material is formed on the pad layer. Ions are implanted in a portion of the layer of semiconductor material to form a doped portion of the layer of semiconductor material. Portions of the layer of semiconductor material are removed to form a first mandrel comprising the layer of semiconductor material, and a second mandrel comprising the doped portion of the layer of semiconductor material. Spacers are formed along sidewalls of the first mandrel and the second mandrel, the spacers along the sidewalls of the first mandrel having a width that is less than a width of the spacers formed along the sidewalls of the second mandrel. The first mandrel and the second mandrel are removed to expose portions of the pad layer. Exposed portions of the pad layer, the tensile strained layer and the compressive strained layer to form a first fin and a second fin, and a gate stack is formed over a channel region of the first fin and a channel region of the second fin.

According to another embodiment of the present invention, a method for forming a semiconductor device comprises forming a strain relaxation buffer layer on a substrate, a tensile strained layer on a first portion of the strain relaxation buffer layer and a compressive strained layer on a second portion of the strain relaxation buffer layer. A pad layer is formed on the tensile strained layer and the compressive strained layer and a layer of semiconductor material is formed on the pad layer. Ions are implanted in a portion of the layer of semiconductor material to form a doped portion of the layer of semiconductor material. Portions of the layer of semiconductor material are removed to form a first mandrel comprising the layer of semiconductor material, and a second mandrel comprising the doped portion of the layer of semiconductor material. An oxide layer is formed on the first mandrel and an oxide layer is formed on the second mandrel, where the oxide layer on the first mandrel has a thickness that is less than the oxide layer on the second mandrel. Portions of the oxide layer are removed on the first mandrel to expose a portion of the first mandrel and portions of the oxide layer are removed on the second mandrel to expose a portion of the second mandrel. The first mandrel and the second mandrel are removed to expose portions of the pad layer. Exposed portions of the pad layer, the tensile strained layer and the compressive strained layer are removed to form a first fin and a second fin, wherein the first fin and the second fin have substantially similar widths, and a gate stack is formed over a channel region of the first fin and a channel region of the second fin.

According to another embodiment of the present invention, a semiconductor device comprises a first semiconductor fin having a first width, the first semiconductor fin is arranged on a first portion of the strain relaxation buffer layer, where the first portion of the strain relaxation buffer layer has a second width and a second semiconductor fin having a width substantially similar to the first width, the second semiconductor fin is arranged on a second portion of the strain relaxation buffer layer, where the second portion of the strain relaxation buffer layer has a third width. A gate stack is arranged over a channel region of the first fin and a channel region of the second fin.

BRIEF DESCRIPTION OF THE DRAWINGS

FIGS. 20-25 illustrate an alternate exemplary method for forming sacrificial spacers using dopants that reduce the oxidation rate of a mandrel.

FIG. 20 illustrates a cut-away view following the formation of a mask.

FIG. 23 illustrates a cut-away view following an oxide growth process that forms a layer of oxide on the sacrificial mandrel and a layer of oxide on the sacrificial mandrel.

FIG. 24 illustrates a cut-away view following an anisotropic etching process that removes portions of the oxide layers to expose portions of the mandrels.

FIG. 25 illustrates a cut-away view following the formation of fins.

DETAILED DESCRIPTION

Strain induced in the channel regions of semiconductor devices often improves the performance characteristics of the devices. In many complementary metal oxide semiconductor (CMOS) devices, a tensile strain is desired in the channel region of an n-type field effect transistor (FET) device (nFET) and a compressive strain is desired in the channel region of a p-type FET device (pFET). Strained channel regions often enhance electron mobility or hole mobility, which improves conductivity through the channel regions of FET devices.

Strain may be induced and modulated by, for example, epitaxially growing crystalline materials on a seed layer where the grown materials have different lattice constants than the seed layer. For example, when silicon is epitaxially grown on a relaxed layer of silicon germanium, a tensile strain is induced in the grown silicon material. Conversely, when a layer of silicon germanium is grown on a silicon seed layer, a compressive strain is induced in the grown layer of silicon germanium.

In CMOS devices, it is desirable to form fins formed from, for example, silicon and silicon germanium on the same wafer. The Si fins are typically tensely strained and used to form nFET devices and the SiGe fins are typically compressively strained and used for pFET devices.

Sidewall image transfer is a patterning and etching process that is often used to form fins with high pitches. Often the Si and SiGe fins are etched simultaneously. However, since Si and SiGe have different etch properties, when such fins are formed, the SiGe fins tend to be narrower than the Si fins when a uniform pattern (i.e., a sidewall image transfer spacer pattern with spacers having uniform widths for both the Si and SiGe fins.) is used to pattern the fins.

Differences in fin widths are undesirable since dissimilar fin widths may reduce the performance of the CMOS device, or contribute to other undesirable manufacturing complications.

The methods and resultant devices described herein provide for the forming of Si and SiGe fins on a wafer having similar widths.

Figure 1:
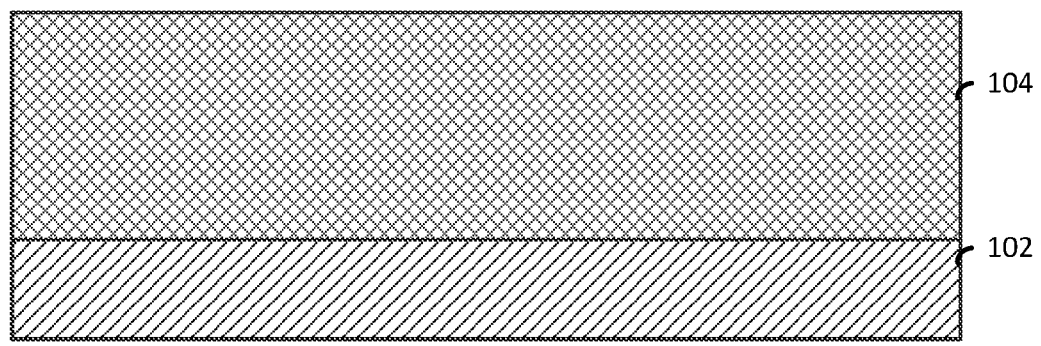
FIG. 1 illustrates a side view of a semiconductor substrate and a strain relaxation buffer (SRB) layer arranged on the semiconductor substrate.

FIG. 1 illustrates a side view of a semiconductor substrate 102 and a strain relaxation buffer (SRB) layer 104 arranged on the semiconductor substrate 102.

Non-limiting examples of suitable materials for the semiconductor substrate 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials may include at least one "III element," such as aluminum (Al), boron (B), gallium (Ga), indium (In), and at least one "V element," such as nitrogen (N), phosphorous (P), arsenic (As), antimony (Sb).

The strain relaxation buffer layer 104 is formed by an epitaxial growth process. In the illustrated embodiment the strain relaxation buffer layer 104 includes SiGe with a concentration of Ge of about 10-80%.

Epitaxial materials may be grown from gaseous or liquid precursors. Epitaxial materials may be grown using ultra-high vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), vapor-phase epitaxy (VPE), molecular-beam epitaxy (MBE), liquid-phase epitaxy (LPE), or other suitable process, or other suitable processes.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Figure 2A:
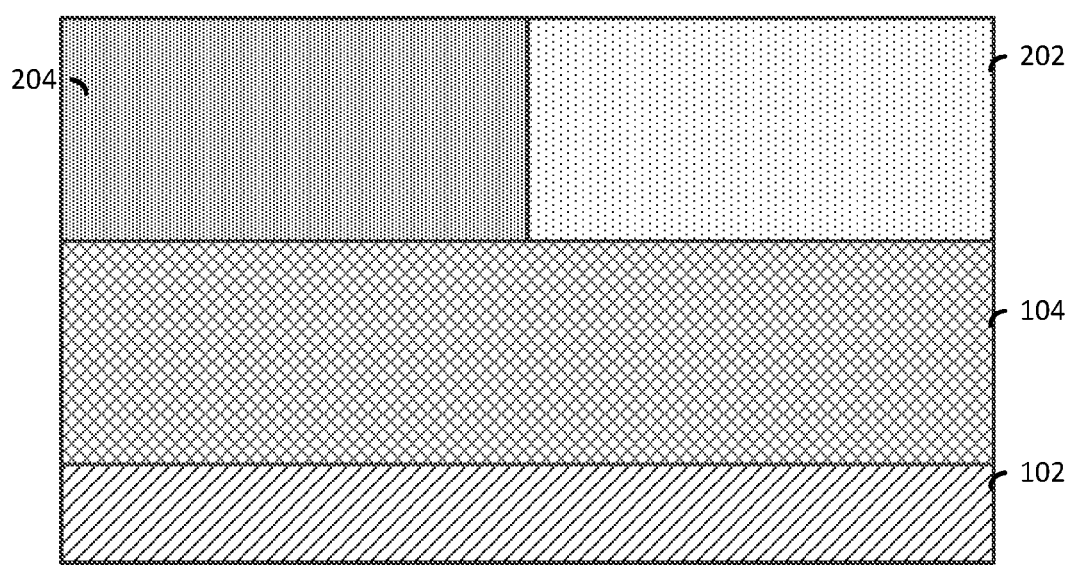
FIG. 2A illustrates a cut-away view along the line A-A (of FIG. 2B) of a tensile strained semiconductor layer formed on one region of the strain relaxation buffer and a compressive strained semiconductor layer.

FIG. 2A illustrates a cut-away view along the line A-A (of FIG. 2B). of a tensile strained semiconductor layer 204 formed on one region of the strain relaxation buffer 104 and a compressive strained semiconductor layer 202 is formed on a second region of the strain relaxation buffer 104. In the illustrated embodiment the tensile strained semiconductor layer 204 includes Si, and the compressive strained semiconductor layer 202 includes SiGe with a concentration of Ge of about 10-40% where the concentration of the Ge in the compressive strained semiconductor layer 202 in is greater than the concentration of Ge in the strain relaxation buffer layer 104.

Figure 2B:
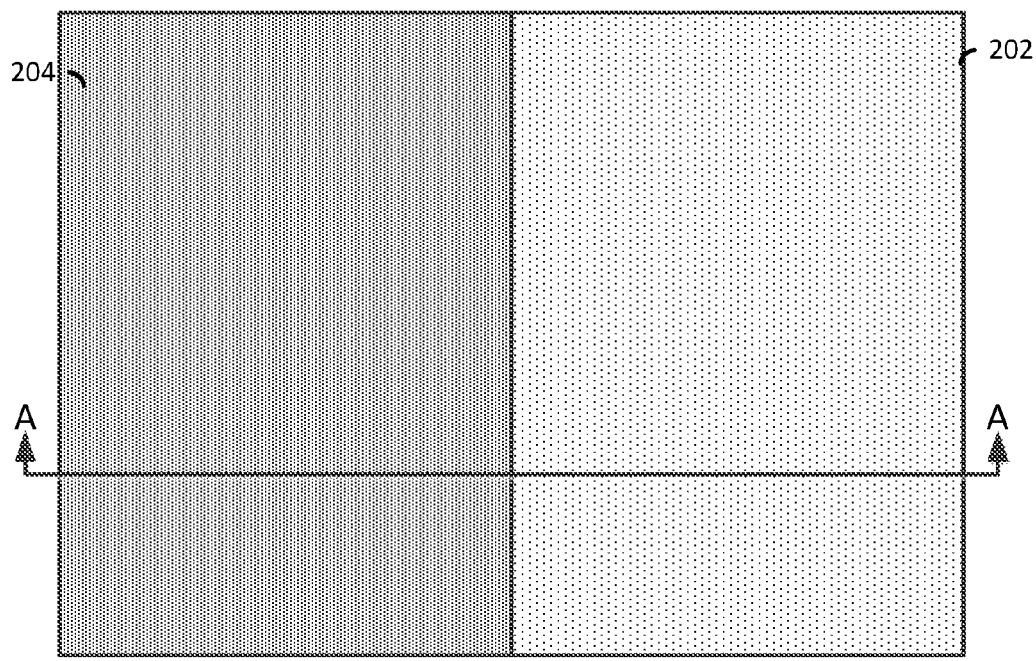
FIG. 2B illustrates a top view of the tensile strained semiconductor layer and the compressive strained semiconductor layer.

The tensile strained semiconductor layer 204 and the compressive strained semiconductor layer 202 are formed by, for example, an epitaxial growth process using block masks. FIG. 2B illustrates a top view of the tensile strained semiconductor layer 204 and the compressive strained semiconductor layer 202.

Figure 3:
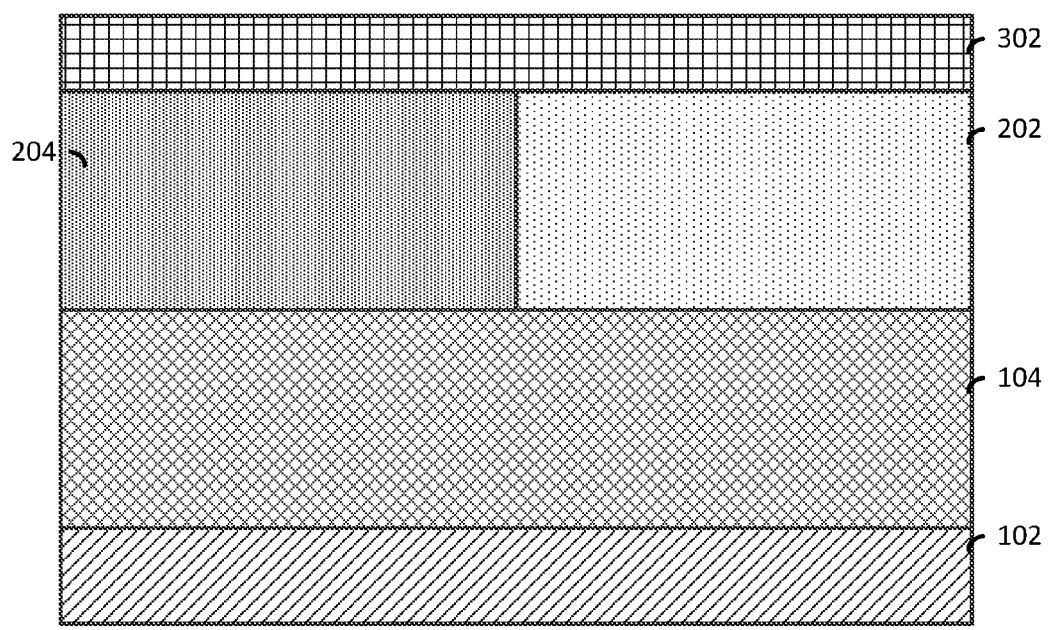
FIG. 3 illustrates a side view following the formation of a pad layer over the tensile strained semiconductor layer and the compressive strained semiconductor layer.

FIG. 3 illustrates a side view following the formation of a pad layer 302 over the tensile strained semiconductor layer 204 and the compressive strained semiconductor layer 202. The pad layer 302 in the illustrated exemplary embodiment may include, for example, silicon oxide, silicon nitride (SiN), SiOCN, SiBCN or any suitable combination of those. The pad layer 302 may be deposited using a deposition process, including, but not limited to, PVD, CVD, PECVD, or any combination thereof.

Figure 4:
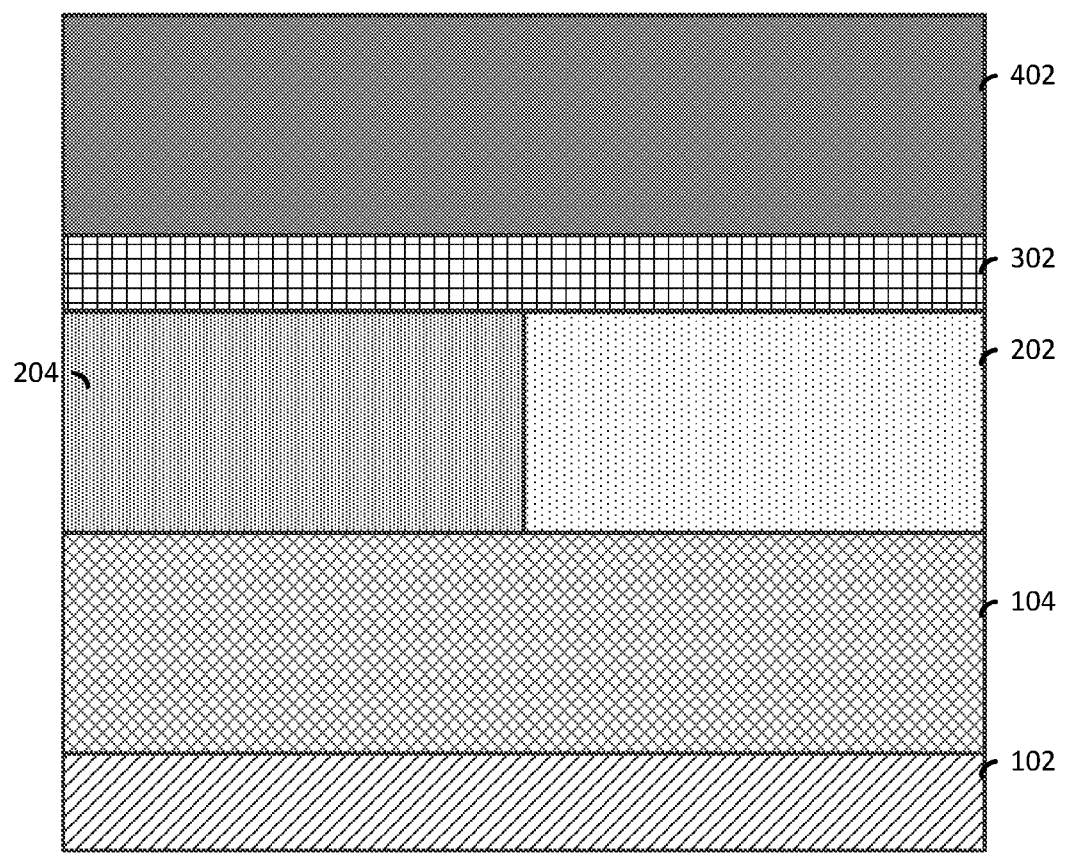
FIG. 4 illustrates a side view following the formation of semiconductor layer.

FIG. 4 illustrates a side view following the formation of semiconductor layer 402. The semiconductor layer 402 in the illustrated embodiment includes an undoped amorphous silicon material however; other suitable materials may be used. The semiconductor layer 402 may be deposited by, for example, CVD.

Figure 5:
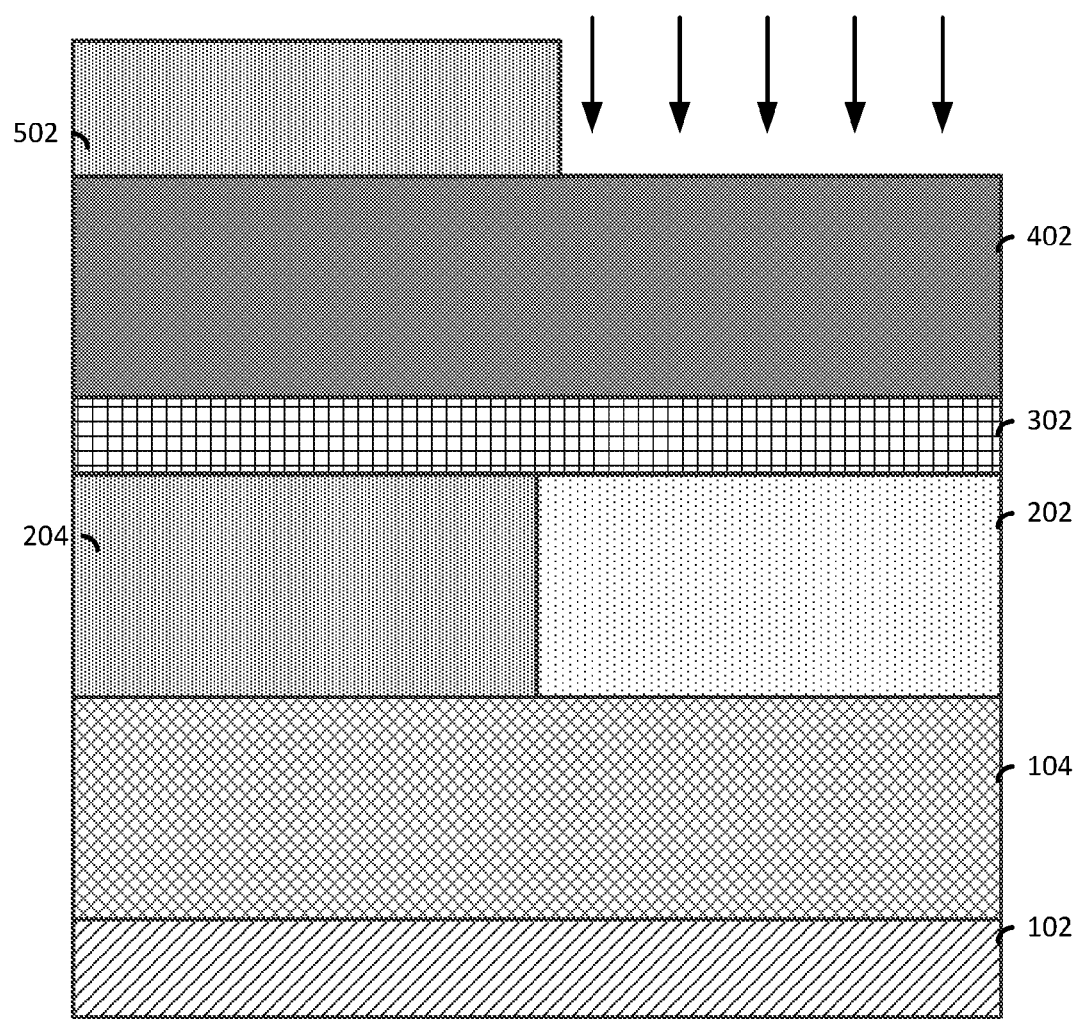
FIG. 5 illustrates a side view of a mask patterned on a portion of the semiconductor layer.

FIG. 5 illustrates a side view of a mask 502 patterned on a portion of the semiconductor layer 402. Suitable resist masks include photoresists, electron-beam resists, ion-beam resists, X-ray resists, and etch resists. The resist may a polymeric spin on material or a polymeric material.

Following the formation of the mask 502, an ion implantation process is performed that implants ions in the exposed portions of the semiconductor layer 402. In the illustrated exemplary embodiment, the ions include, for example, boron, phosphorus, arsenic, indium, or fluorine. Such species enhance the oxidation of silicon layer 402.

Figure 6A:
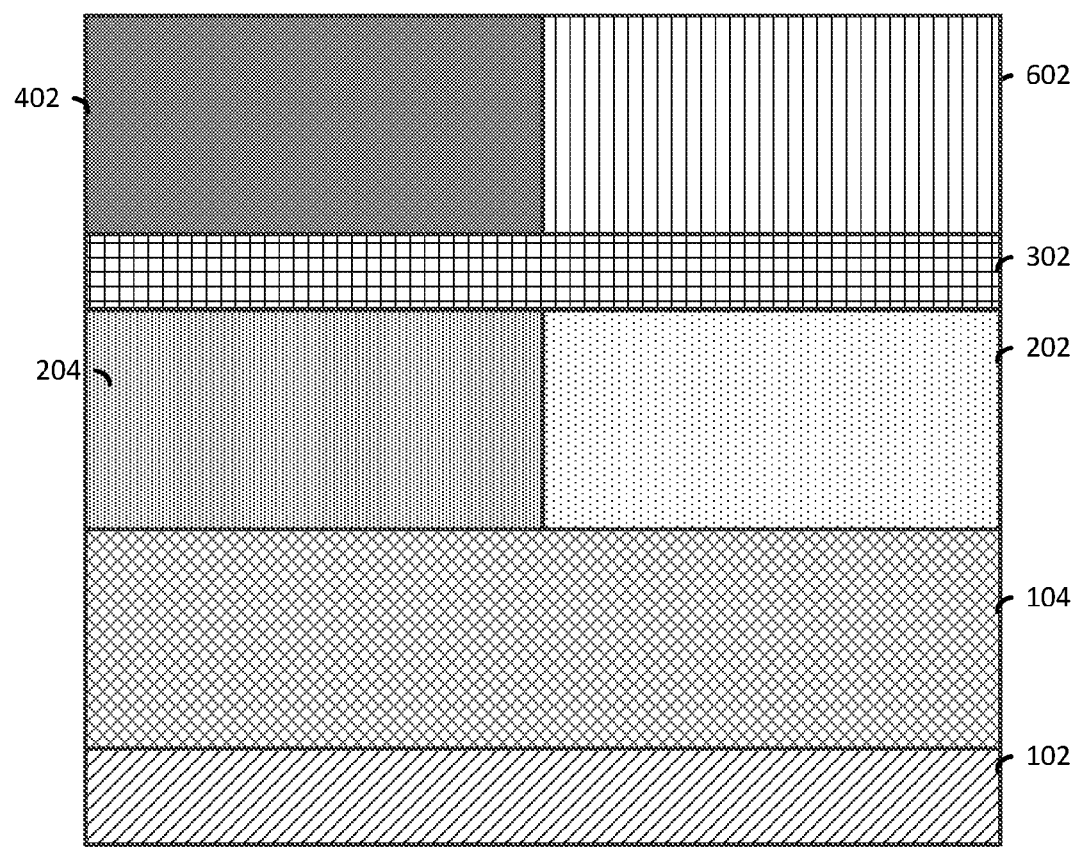
FIG. 6A illustrates a cut-away view along the line A-A (of FIG. 6B) following the removal of the mask and the ion implantation process.

FIG. 6A illustrates a cut-away view along the line A-A (of FIG. 6B) following the removal of the mask 502 and the ion implantation process. The mask 502 may be removed by, for example, ashing. The ashing process may be used to remove a photoresist material, amorphous carbon, or organic planarization (OPL) layer. Ashing is performed using a suitable reaction gas, for example, $O_2$, $N_2$, $H2/N2$, $O_3$, $CF_4$, or any combination thereof.

Figure 6B:
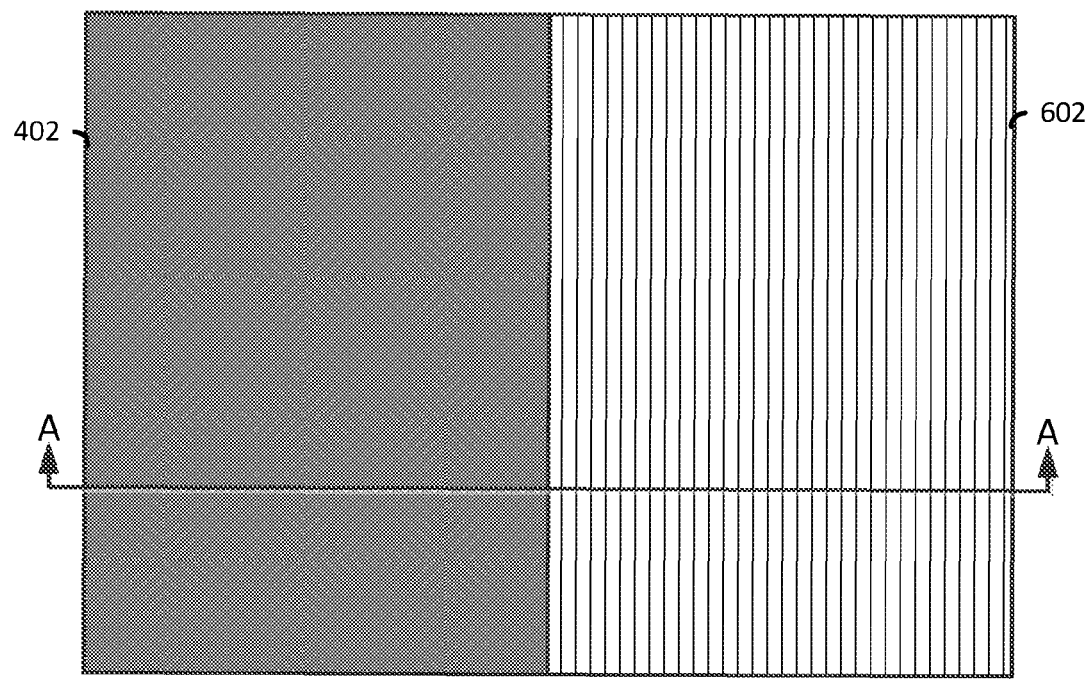
FIG. 6B illustrates a top view of the semiconductor layer and the doped semiconductor region.

The ion implantation process results in an undoped region of the semiconductor layer 402 and a doped semiconductor region 602. FIG. 6B illustrates a top view of the semiconductor layer 402 and the doped semiconductor region 602.

Figure 7A:
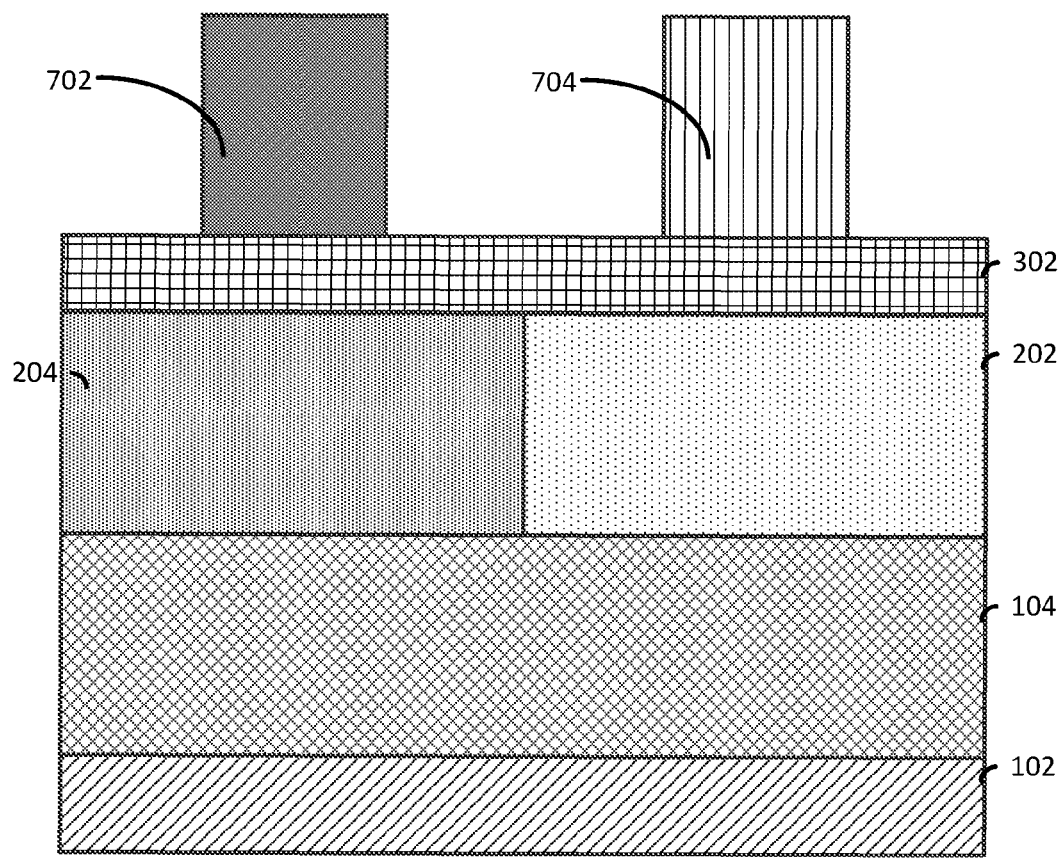
FIG. 7A illustrates a cut-away view along the line A-A (of FIG. 7B) following the patterning of sacrificial mandrels.
Figure 7B:
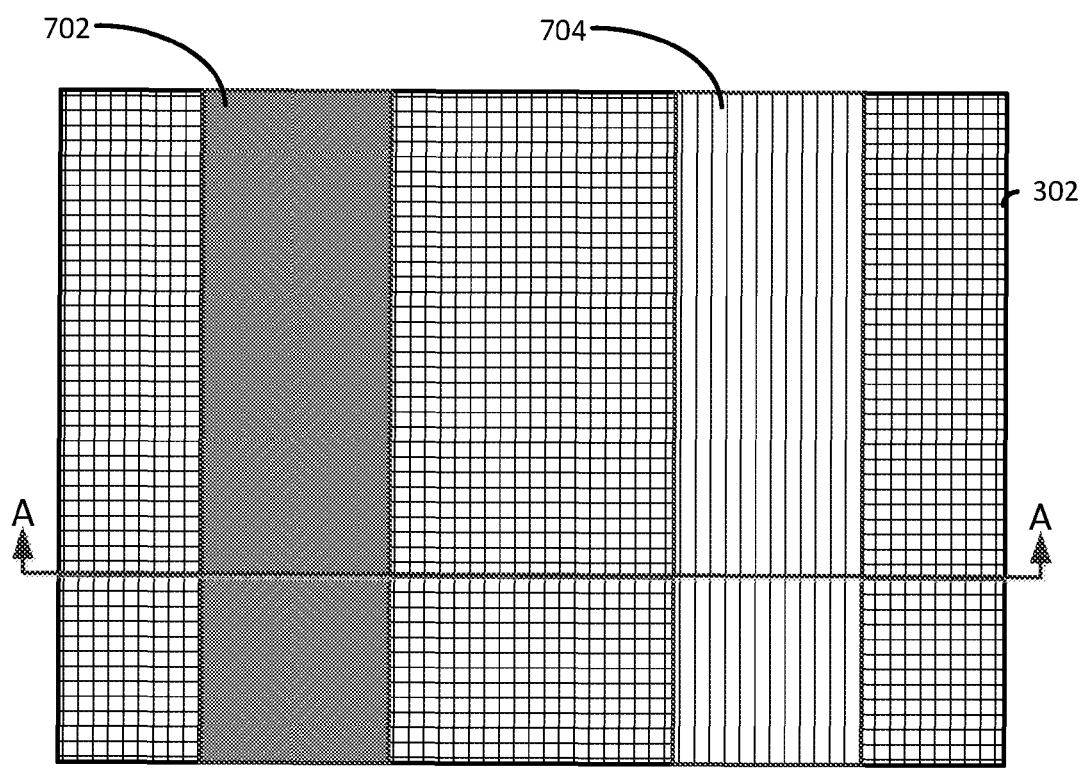
FIG. 7B illustrates a top view of the sacrificial mandrels.

FIG. 7A illustrates a cut-away view along the line A-A (of FIG. 7B) following the patterning of sacrificial mandrels (mandrels) 702 and 704. In this regard, a lithographic patterning and etching process is performed to remove portions of the semiconductor layer 402 and a doped semiconductor region 602 to expose portions of the pad layer 302. The sacrificial mandrel 702 is formed from the undoped semiconductor layer 402 and includes undoped semiconductor material. The sacrificial mandrel 704 is formed from the doped semiconductor region 602 and includes doped semiconductor material 602. The sacrificial mandrels 702 and 704 may be formed from, for example, a reactive ion etching process. FIG. 7B illustrates a top view of the sacrificial mandrels 702 and 704.

Figure 8:
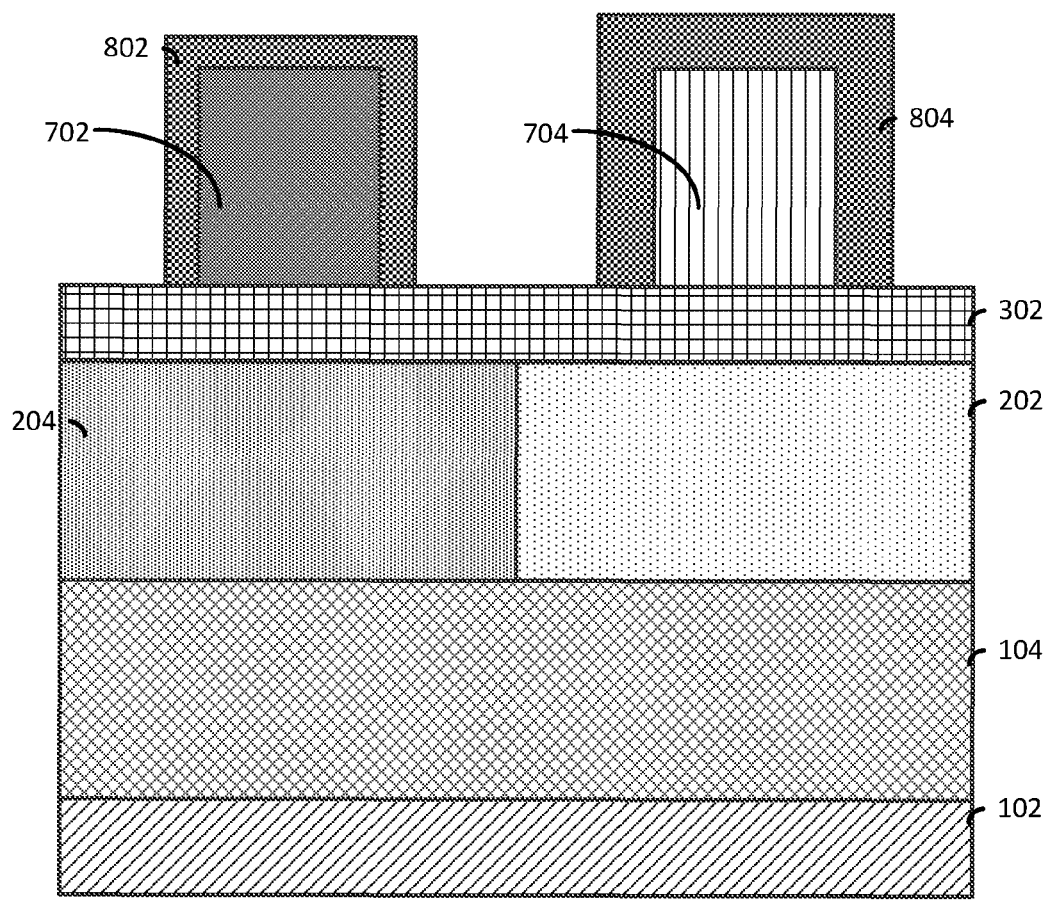
FIG. 8 illustrates a cut-away view following an oxide growth process that forms a layer of oxide on the sacrificial mandrel and a layer of oxide on the sacrificial mandrel.

FIG. 8 illustrates a cut-away view following an oxide growth process that forms a layer of oxide 802 on the sacrificial mandrel 702 and a layer of oxide 804 on the sacrificial mandrel 704. In the illustrated exemplary embodiment, the oxide layer 802 is thinner than the oxide layer 804. The difference in thickness of the oxide layers 802 and 804 is a result of the dissimilar materials of the sacrificial mandrels 702 and 704. In this regard, the doped semiconductor mandrel 704 oxidizes at a faster rate than the undoped semiconductor sacrificial mandrel 702.

Figure 9:
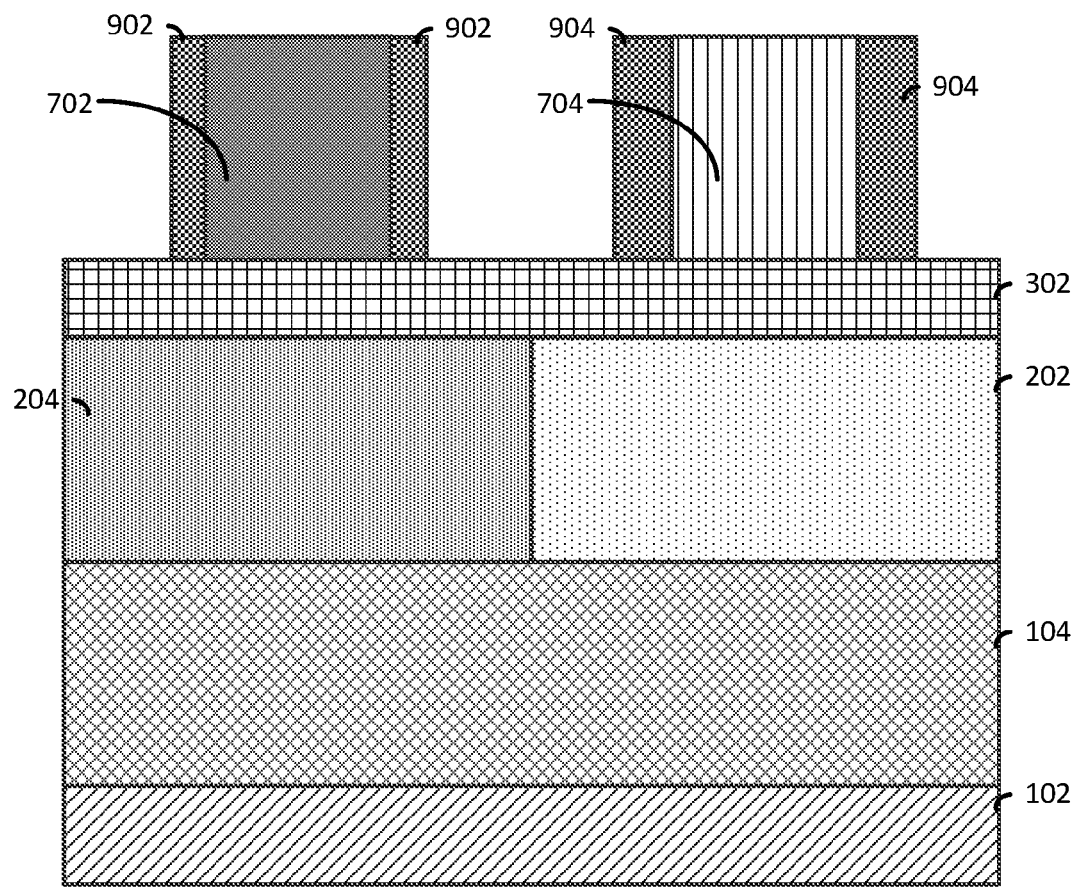
FIG. 9 illustrates a cut-away view following an anisotropic etching process that removes portions of the oxide layers to expose portions of the mandrels.

FIG. 9 illustrates a cut-away view following an anisotropic etching process that removes portions of the oxide layers 802 and 804 to expose portions of the mandrels 702 and 704. The resultant structure includes spacers 902 and 904 arranged along sidewalls of the mandrels 702 and 704.

Figure 10A:
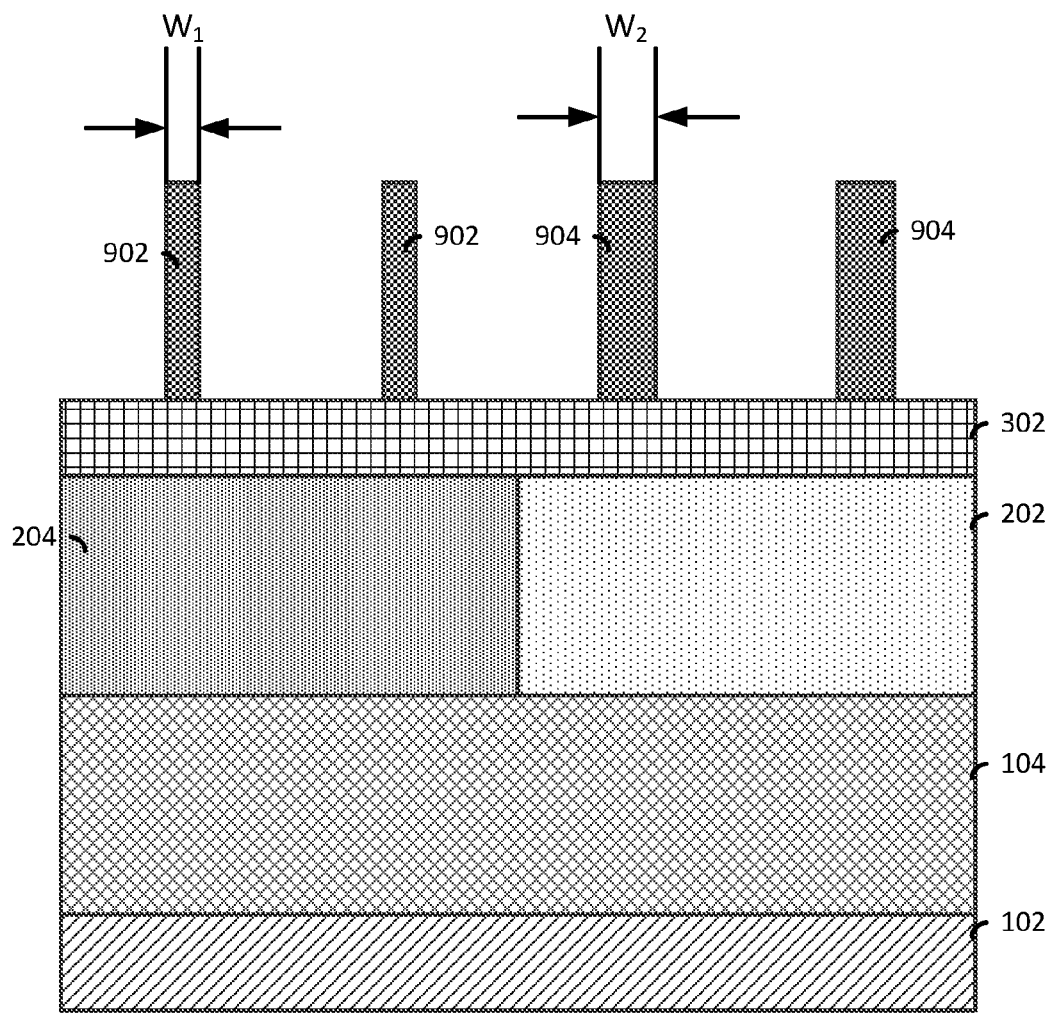
FIG. 10A illustrates a cut-away view along the line A-A (of FIG. 10B) following the removal of the mandrels (of FIG. 9) to expose portions of the pad layer.
Figure 10B:
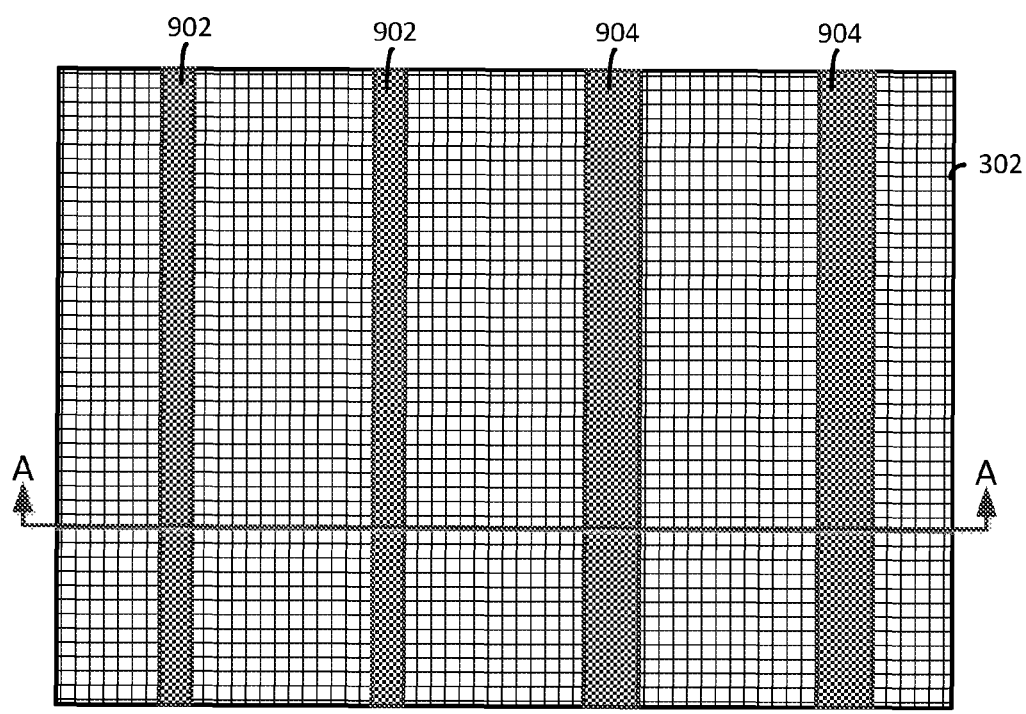
FIG. 10B illustrates a top view of the spacers arranged on the pad layer.

FIG. 10A illustrates a cut-away view along the line A-A (of FIG. 10B) following the removal of the mandrels 702 and 704 (of FIG. 9) to expose portions of the pad layer 302. The spacers 902 have a width $W_1$ while the spacers 904 have a width $W_2$, where $W_2 > W_1$. FIG. 10B illustrates a top view of the spacers 902 and 904 arranged on the pad layer 302.

Figure 11A:
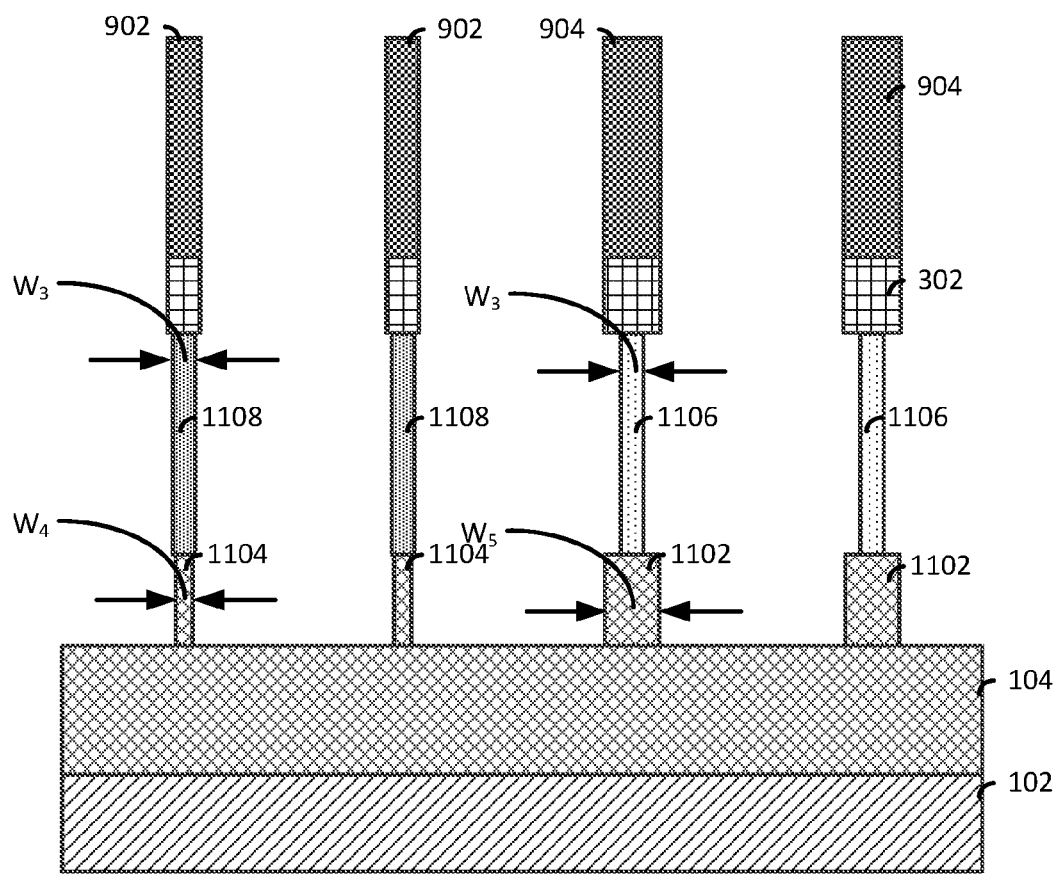
FIG. 11A illustrates a cut-away view along the line A-A (of FIG. 11B) following an anisotropic etching process.

FIG. 11A illustrates a cut-away view along the line A-A (of FIG. 11B) following an anisotropic etching process such as, for example, reactive ion etching. The etching process removes exposed portions of the pad layer 302, the tensile strained semiconductor layer 204 and the compressive strained semiconductor layer 202, and the strain relaxation buffer layer 104 to form fins 1108 and 1106.

Since the etching process tends to etch the compressive strained semiconductor layer 202 at a faster rate (laterally) than the tensile strained semiconductor layer 204, the spacers 902 and 904 have different widths such that the fins 1108 and 1106 that are formed in the tensile strained semiconductor layer 204 and the compressive strained semiconductor layer 202 respectively have substantially the same width $W_3$.

Figure 11B:
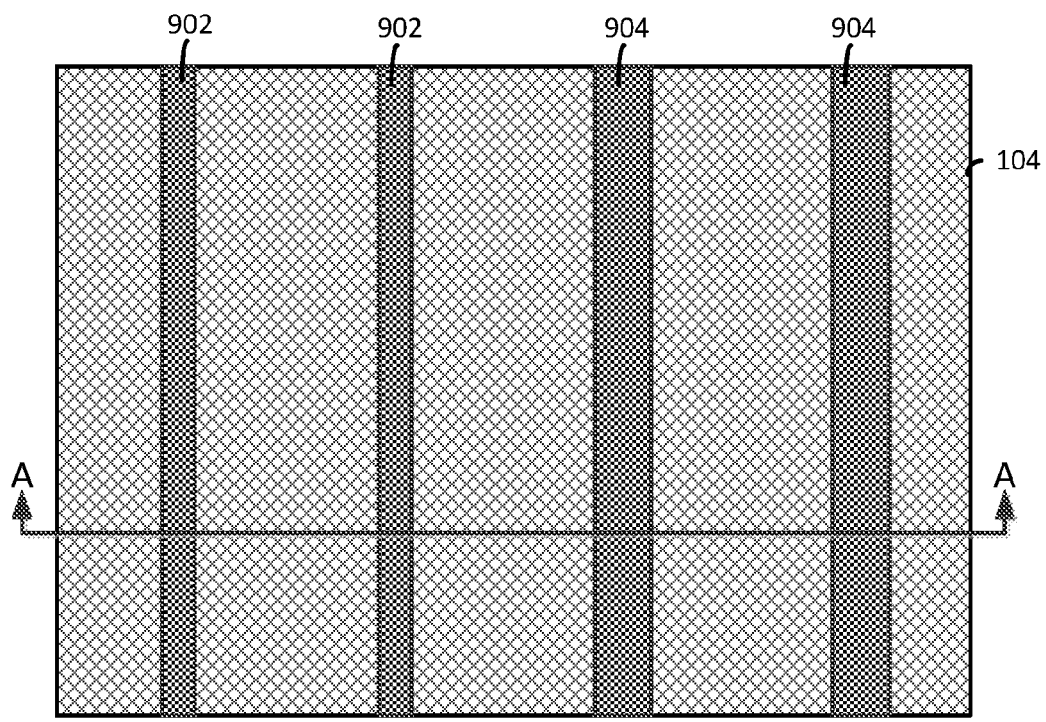
FIG. 11B illustrates a top view following the anisotropic etching process.

The etching of portions of the strain relaxation buffer layer 104 results in the formation of fins 1104 and 1102 beneath the fins 1108 and 1106 respectively. The fins 1104 and 1102 formed from the strain relaxation buffer layer 104 etch at different rates (laterally) than the fins 1108 and 1106 since the strain relaxation buffer layer 104 is formed from a dissimilar material than the fins 1104 and 1102. The resultant structure includes a fin 1104 having a width $W_4$ arranged below the fin 1108, where $W_4 < W_3$, and a fin 1102 having a width $W_5$ arranged below the fin 1106, where $W_5 > W_3$, and $W_4 < W_5$. FIG. 11B illustrates a top view following the formation of the fins 1108 and 1106 (of FIG. 11A).

Figure 12:
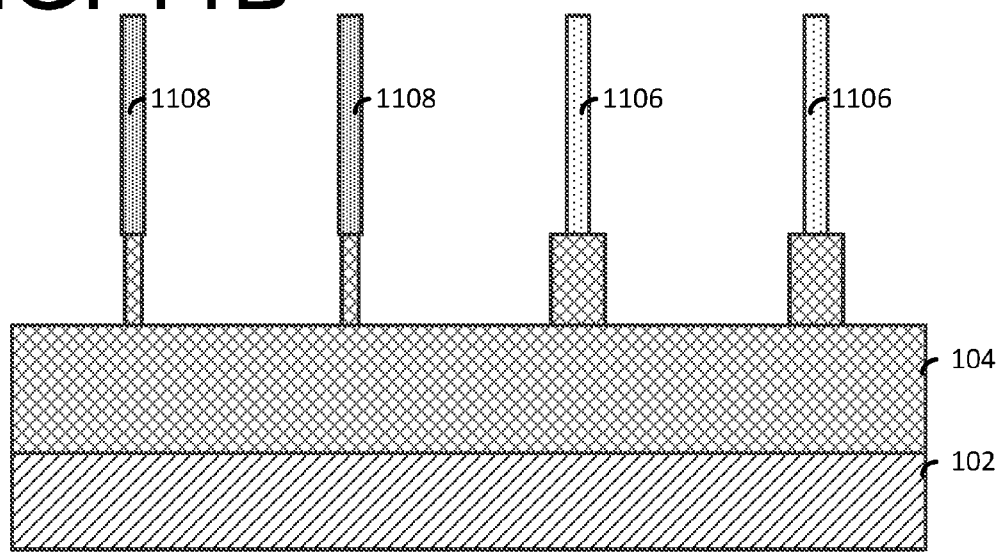
FIG. 12 illustrates a cut-away view following the removal of the spacers and the pad layer (of FIG. 11A).

FIG. 12 illustrates a cut-away view following the removal of the spacers 902 and 904 and the pad layer 302 (of FIG. 11A).

Figure 13A:
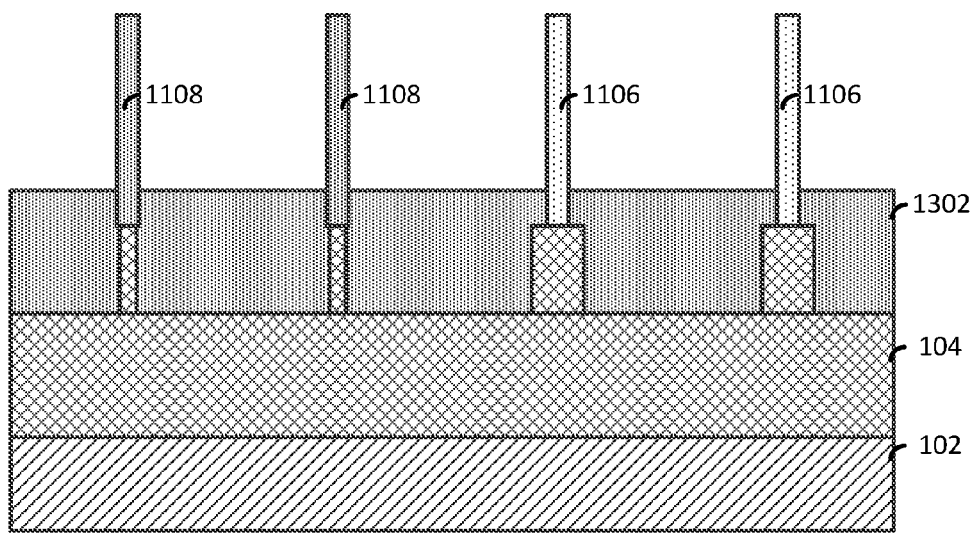
FIG. 13A illustrates a cut-away view along the line A-A (of FIG. 13B) following the formation of an isolation region.

FIG. 13A illustrates a cut-away view along the line A-A (of FIG. 13B) following the formation of an isolation region 1302. The isolation region 1304 is formed by, for example, depositing an insulator material such as, silicon dioxide and recessing the insulator material to expose the fins 1108 and 1106.

Figure 13B:
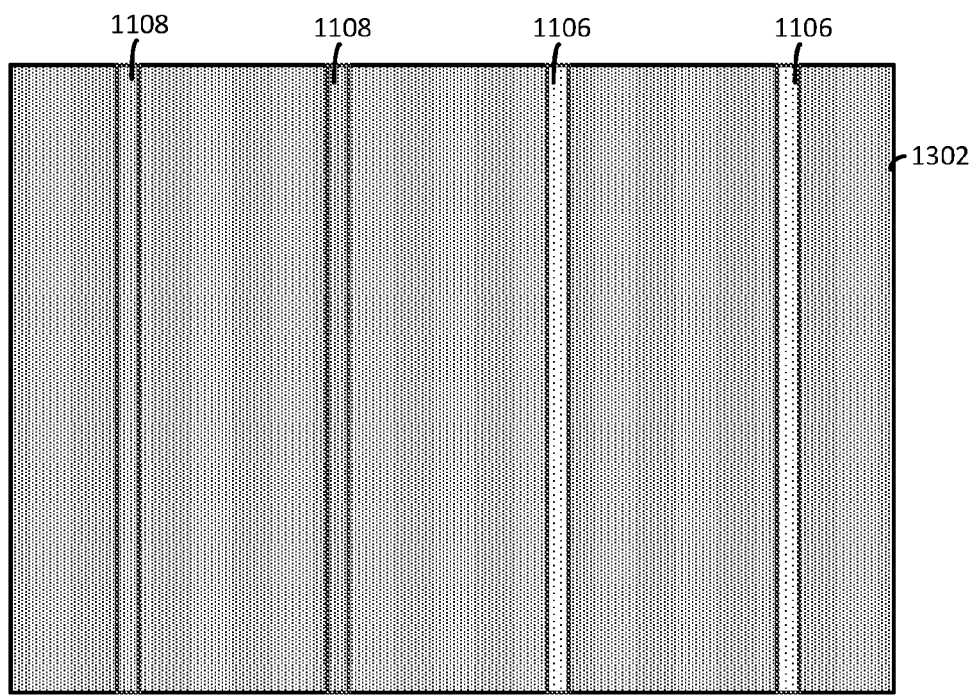
FIG. 13B illustrates a top view of the fins 1108 and 1106 following the formation of the isolation region.

In the illustrated embodiment, at least one isolation region is a shallow trench isolation region ("STI"). However, the isolation region 1302 may be a trench isolation region, a field oxide isolation region (not shown), or any other type of isolation region. The isolation region 1302 provides isolation between neighboring gate structure regions, and may be used when the neighboring gates have opposite conductivities, e.g., nFETs and pFETs. As such, the isolation region 1302 separates an nFET device region from a pFET device region. FIG. 13B illustrates a top view of the fins 1108 and 1106 following the formation of the isolation region 1302.

Figure 14A:
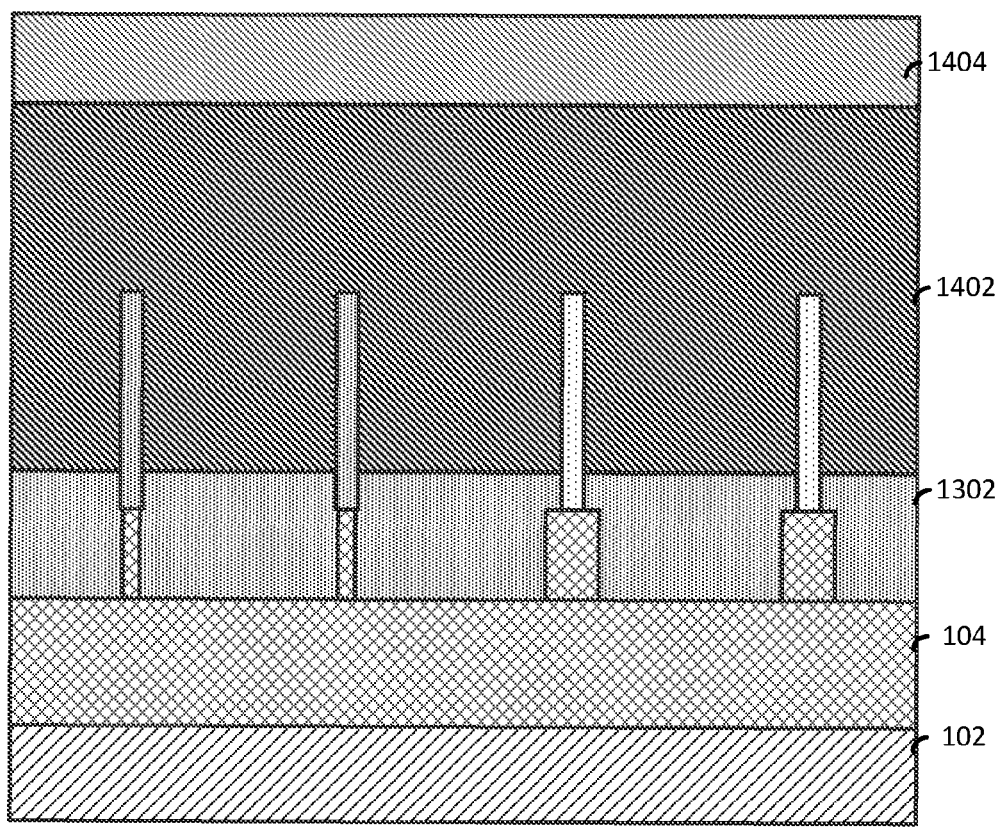
FIG. 14A illustrates a cut-away view along the line B-B (of FIG. 14B) following the formation of a sacrificial gate.

FIG. 14A illustrates a cut-away view along the line B-B (of FIG. 14B) following the formation of a sacrificial gate 1402. The sacrificial gate 1402 in the exemplary embodiment are formed by depositing a layer (not shown) of sacrificial gate material such as, for example, amorphous silicon (aSi), or polycrystalline silicon (polysilicon) material or another suitable sacrificial gate material. The sacrificial gate 1402 may further comprises a sacrificial gate dielectric material such as silicon oxide between the nanowires and aSi or polysilicon material.

The layer sacrificial gate material may be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 1404. The hardmask layer may be deposited using a deposition process, including, but not limited to, PVD, CVD, PECVD, or any combination thereof.

Figure 14B:
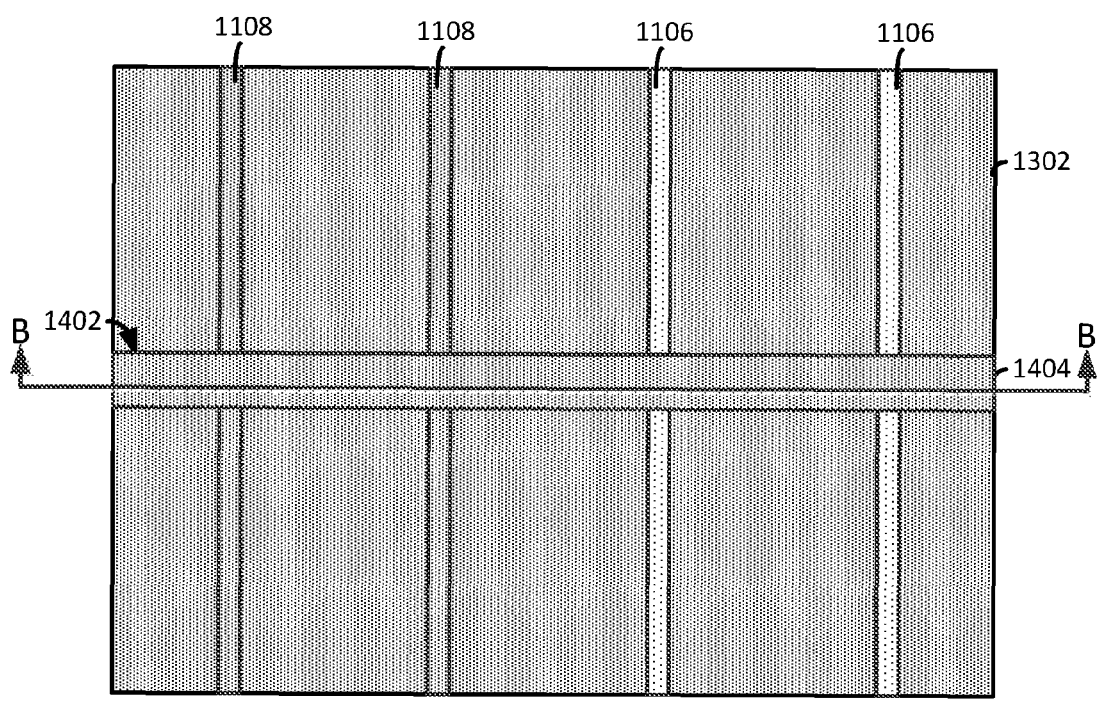

Following the deposition of the layer sacrificial gate material and the hardmask layer, a lithographic patterning and etching process such as, for example, reactive ion etching or a wet etching process is performed to remove exposed portions of the hardmask layer and the layer of sacrificial gate material form the sacrificial gate 1402 and the sacrificial gate cap 1404. FIG. 14B illustrates a top view of the sacrificial gate 1402.

Figure 15:
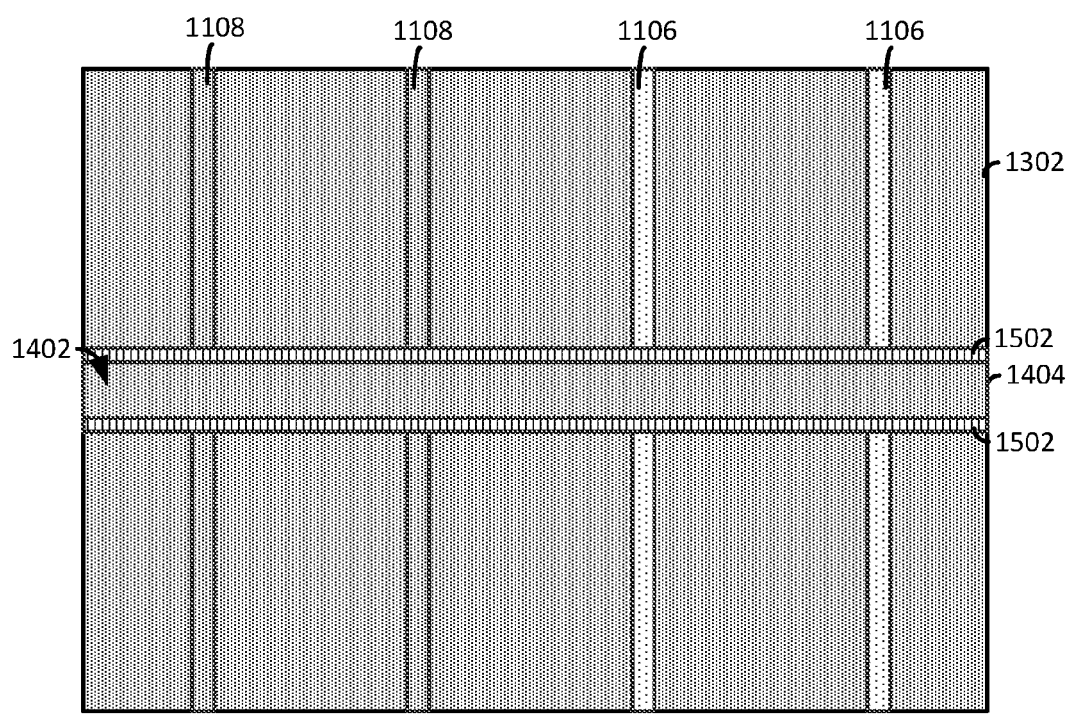
FIG. 15 illustrates a top view following the formation of spacers adjacent to the sacrificial gate.

FIG. 15 illustrates a top view following the formation of spacers 1502 adjacent to the sacrificial gate 1402. The spacers 1502 in the illustrated embodiment are formed by depositing a layer of spacer material (not shown) over the exposed portions of the isolation region 1302, the fins 1106 and 1108, and the sacrificial gates 1402. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Following the deposition of the layer of spacer material, a suitable anisotropic etching process such as, for example, a reactive ion etching process is performed to remove portions of the layer of spacer material and form the spacers 1502.

Figure 16:
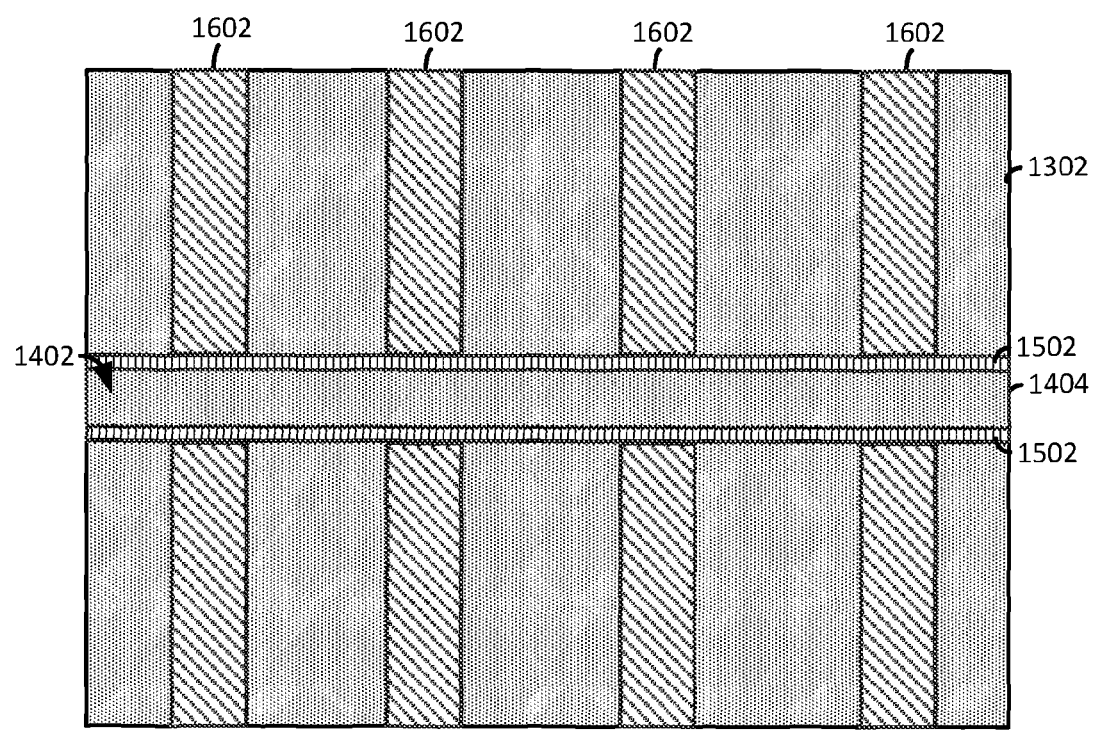
FIG. 16 illustrates a top view following the formation of source/drain region.

FIG. 16 illustrates a top view following the formation of source/drain region 1602. The source/drain regions 1602 are formed by an epitaxial growth process that deposits a crystalline overlayer of semiconductor material onto the exposed crystalline seed material of the exposed fin 1106 and 1108 to form the source/drain regions 1602.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $2 \times 10^{21}$ cm$^{-3}$, or preferably between $2 \times 10^{20}$ cm$^{-3}$ to $1 \times 10^{21}$ cm$^{-3}$.

Figure 17A:
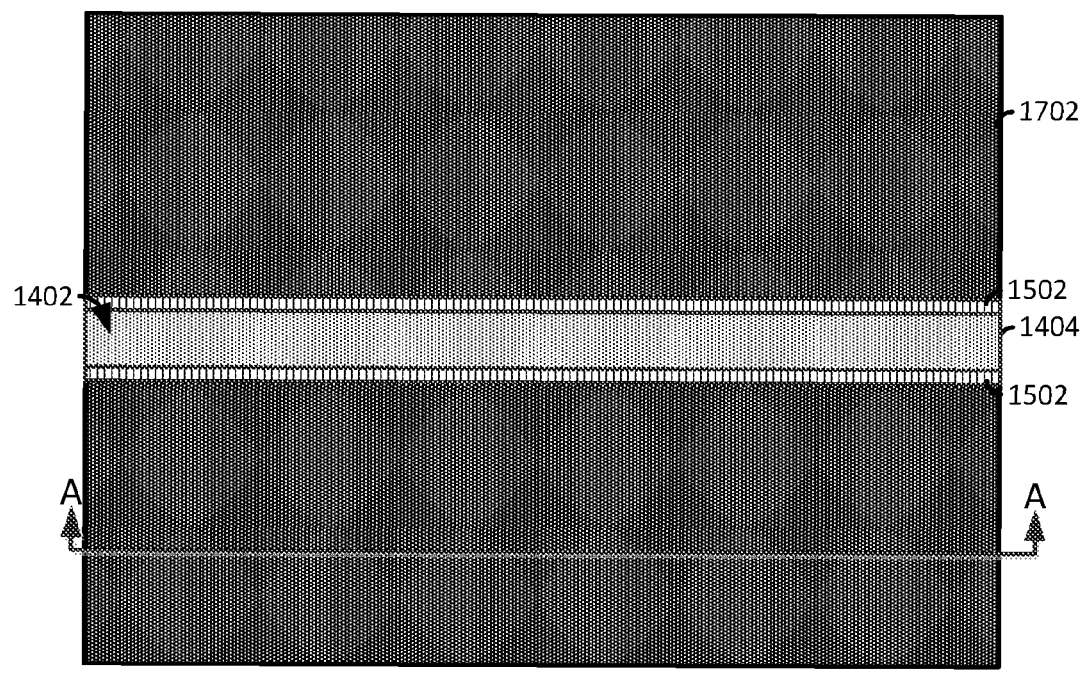
FIG. 17A illustrates top view following the formation of an inter-level dielectric layer over exposed portions of the source/drain regions.

FIG. 17A illustrates top view following the formation of an inter-level dielectric layer 1702 over exposed portions of the source/drain regions 1602.

Figure 17B:
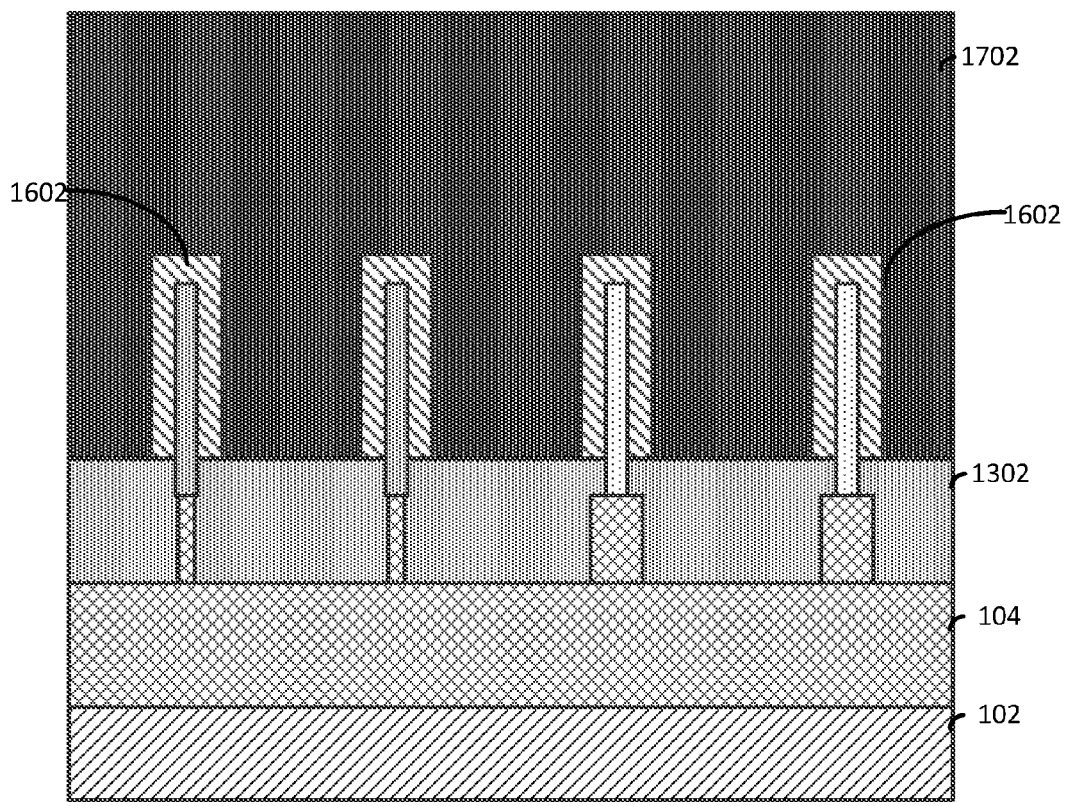
FIG. 17B illustrates a cut-away view along the line A-A (of FIG. 17A) of the source/drain regions and the inter-level dielectric layer.

The inter-level dielectric layer 1302 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1302 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1302, a planarization process such as, for example, chemical mechanical polishing is performed. FIG. 17B illustrates a cut-away view along the line A-A (of FIG. 17A) of the source/drain regions 1602 and the inter-level dielectric layer 1302.

Figure 18:
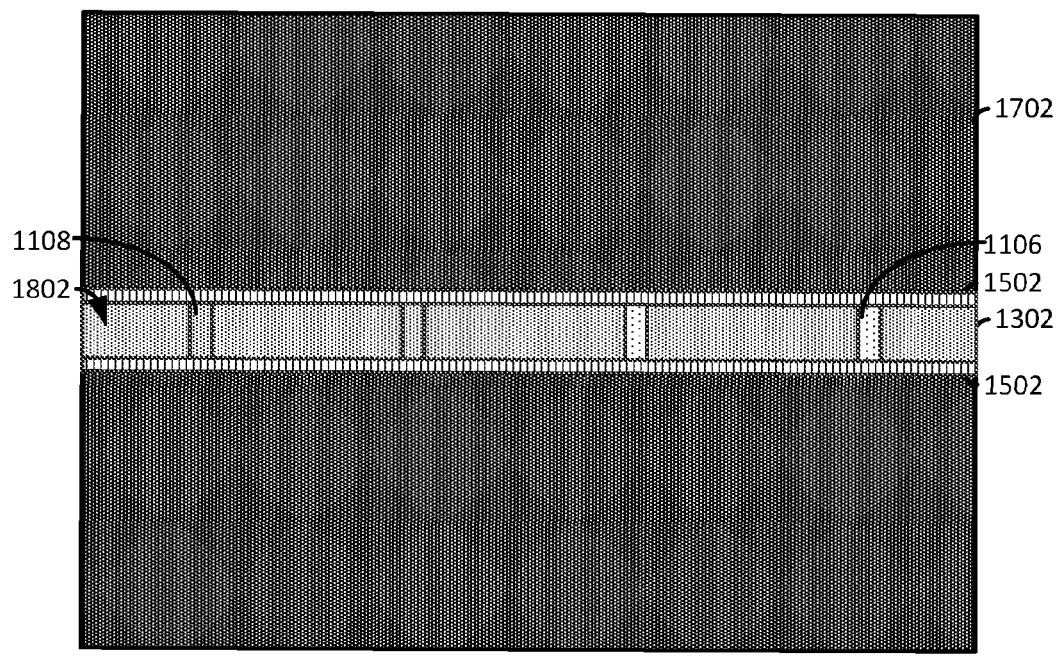
FIG. 18 illustrates a top view following the removal of the sacrificial gate (of FIG. 17A) to form cavities that expose the channel regions of the fins.

FIG. 18 illustrates a top view following the removal of the sacrificial gate 1402 (of FIG. 17A) to form cavities 1802 that expose the channel regions of the fins 1106 and 1108. The sacrificial gates 1402 may be removed by performing a dry etch process, for example, RIE, followed by a wet etch process. The wet etch process is selective to (will not substantially etch) the spacers 1502 and the inter-level dielectric material. The chemical etch process may include, but is not limited to, hot ammonia or tetramethylammonium hydroxide (TMAH).

Figure 19A:
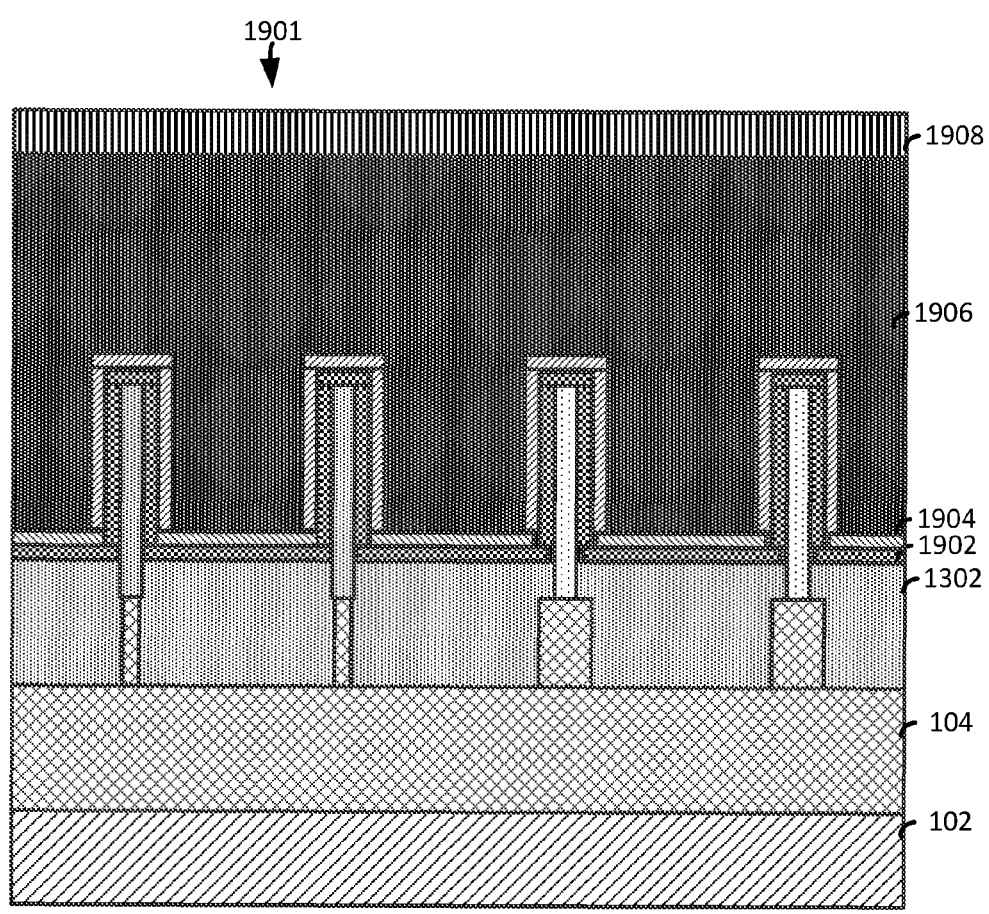
FIG. 19A illustrates a cut-away view along the line B-B (of FIG. 19B) following the formation of a replacement metal gate stack (gate stack).
Figure 19B:
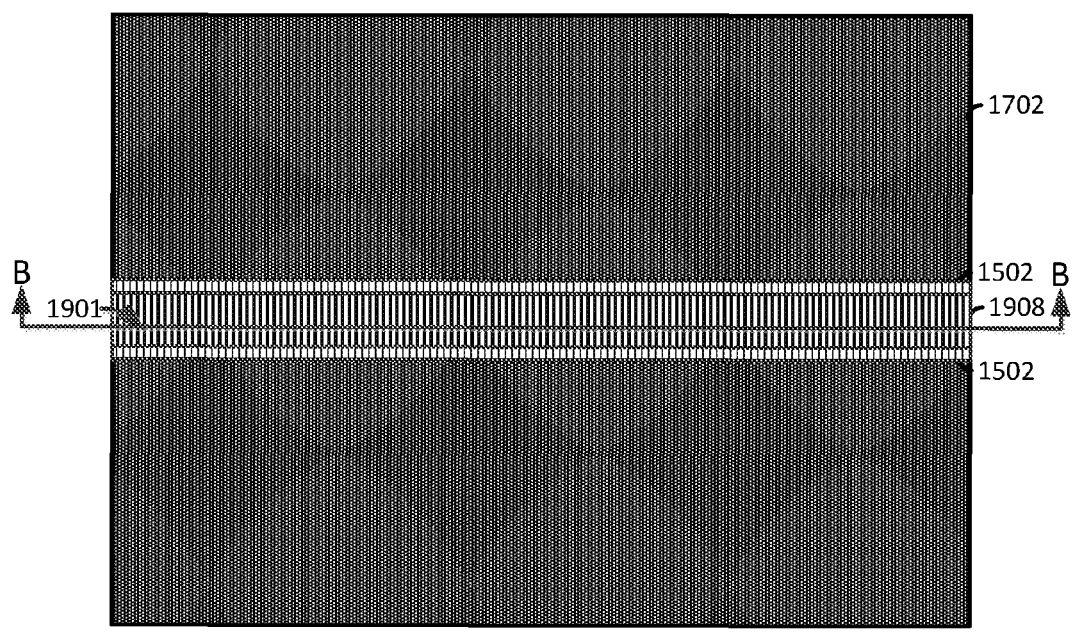
FIG. 19B illustrates a top view of the gate stack.

FIG. 19A illustrates a cut-away view along the line B-B (of FIG. 19B) following the formation of a replacement metal gate stack (gate stack) 1901. FIG. 19B illustrates a top view of the gate stack 1901. The gate stack 1901 include high-k metal gates formed, for example, by filling the cavity 1802 (of FIG. 18) with one or more gate dielectric 1902 materials, one or more workfunction metals 1904, and one or more metal gate conductor 1906 materials. The gate dielectric 1902 material(s) can be a dielectric material having a dielectric constant greater than 3.9, 7.0, or 10.0. Non-limiting examples of suitable materials for the dielectric 1902 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric 1902 materials may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 1904 may be disposed over the gate dielectric 1902 material. The type of work function metal(s) 1904 depends on the type of transistor and may differ between the nFET and pFET devices. Non-limiting examples of suitable work function metals 1904 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor 1906 material(s) is deposited over the gate dielectric 1902 materials and work function metal(s) 1904 to form the gate stack 1901. Non-limiting examples of suitable conductive metals include aluminum (Al), platinum (Pt), gold (Au), tungsten (W), titanium (Ti), or any combination thereof. The gate conductor 1906 material(s) may be deposited by a suitable deposition process, for example, CVD, PECVD, PVD, plating, thermal or e-beam evaporation, and sputtering.

Following the deposition of the gate dielectric 1902 materials, the work function metal(s) 1904, and the gate conductor 1906 material(s), planarization process, for example, chemical mechanical planarization (CMP), is performed to remove the overburden of the deposited gate materials and form the gate stack 1901. A gate cap 1908 may be formed over the gate stack 1901.

After the gate stack 1901 is formed, additional insulating material (not shown) may be deposited over the device(s). The insulating material may be patterned to form cavities (not shown) that expose portions of the source/drain region 1602 and the gate stack 1901. The cavities may be filled by a conductive material (not shown) and, in some embodiments, a liner layer (not shown) to form conductive contacts (not shown).

FIGS. 20-25 illustrate an alternate exemplary method for forming sacrificial spacers using dopants that reduce the oxidation rate of a mandrel such that the resultant sacrificial spacers, and resultant fins (of dissimilar materials) have similar widths when patterned by the sacrificial spacers having different widths.

Figure 20:
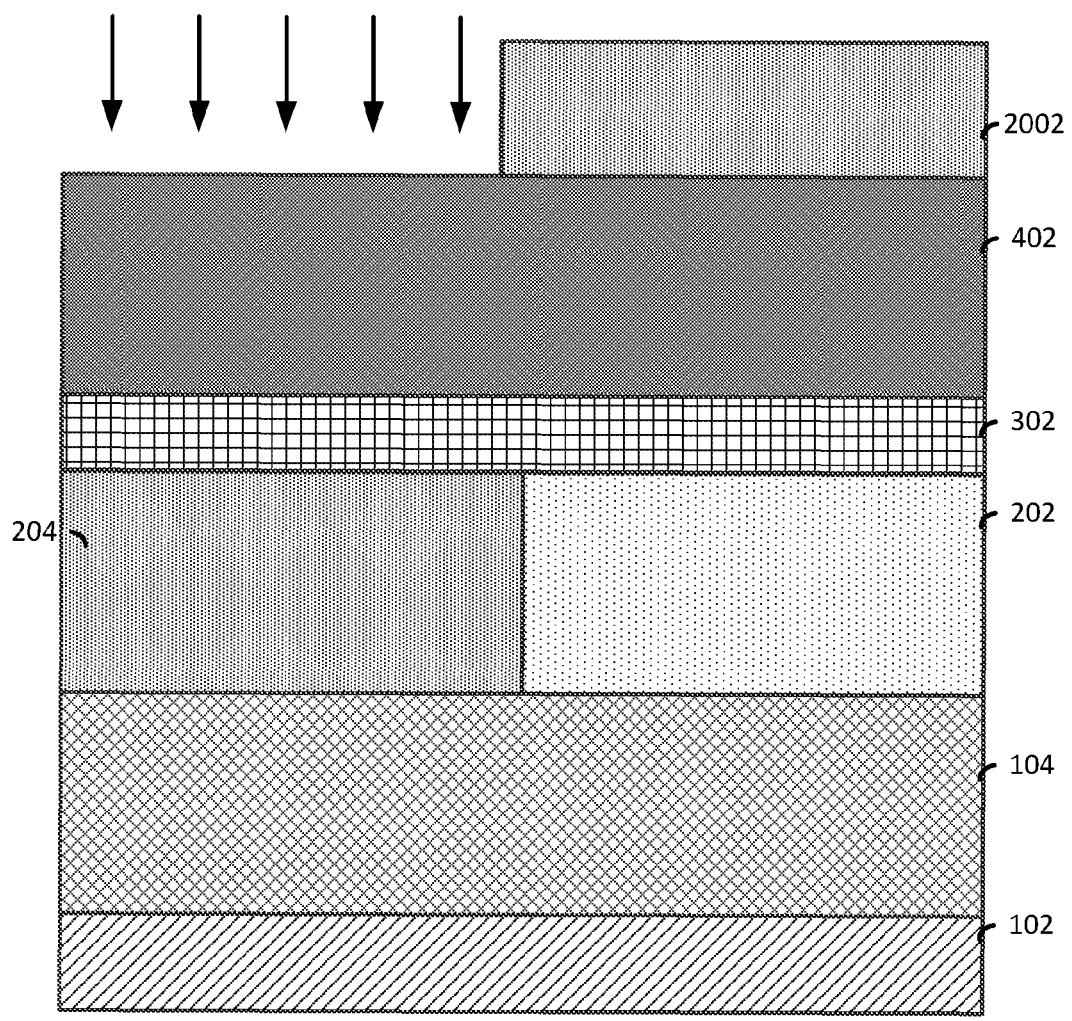

FIG. 20 illustrates a cut-away view of a similar arrangement as described above in FIG. 5, however the mask 2002 is arranged on another portion of the semiconductor layer 402.

Following the formation of the mask 2002, an ion implantation process is performed that implants ions in the exposed portions of the semiconductor layer 402. In the illustrated exemplary embodiment, the ions include, for example, nitrogen, xenon, and argon. Such species reduce the oxidation of silicon layer 402. After ion implantation, the dopant concentration ranges from about 3E18/cm$^3$ to 4E21 cm$^3$.

Figure 21A:
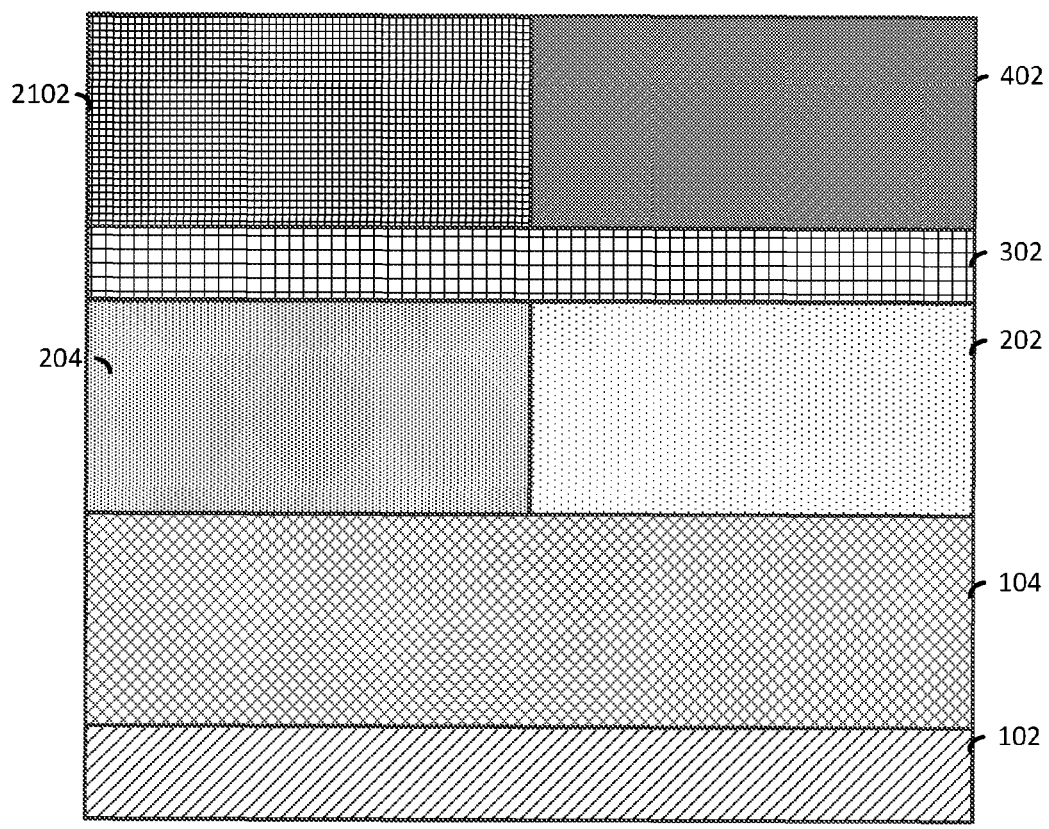
FIG. 21A illustrates a cut-away view along the line A-A (of FIG. 21B) following the removal of the mask (of FIG. 20) and the ion implantation process

FIG. 21A illustrates a cut-away view along the line A-A (of FIG. 21B) following the removal of the mask 2002 (of FIG. 20) and the ion implantation process. The mask 2102 may be removed by, for example, ashing.

Figure 21B:
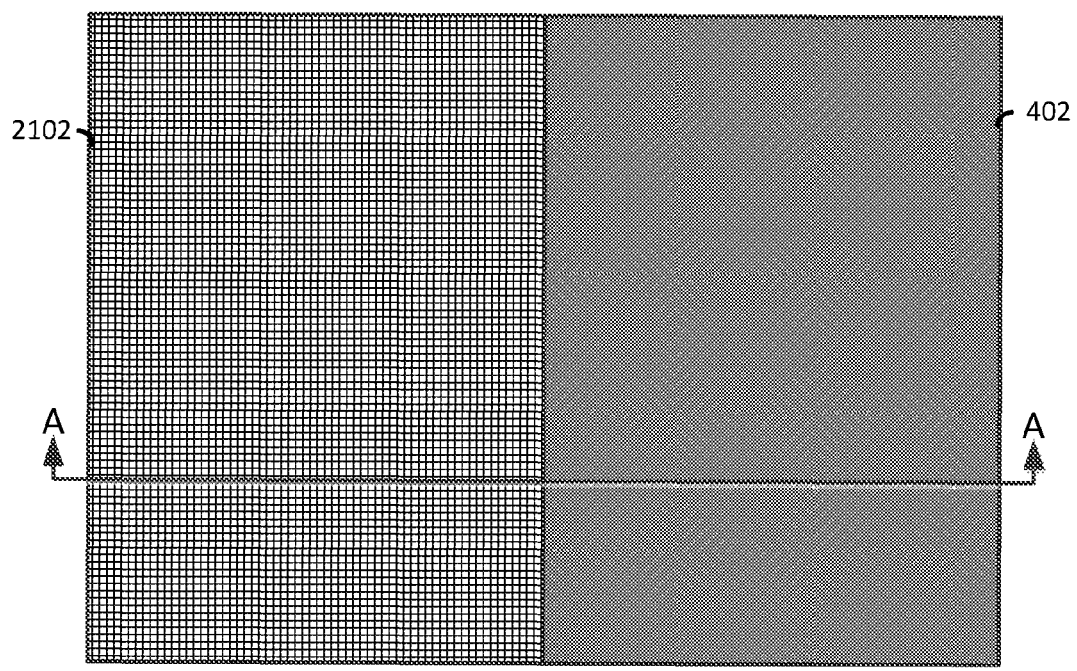
FIG. 21B illustrates a top view of the semiconductor layer 402 and the doped semiconductor region.

The ion implantation process results in an undoped region of the semiconductor layer 402 and a doped semiconductor region 2102. FIG. 21B illustrates a top view of the semiconductor layer 402 and the doped semiconductor region 2102.

Figure 22A:
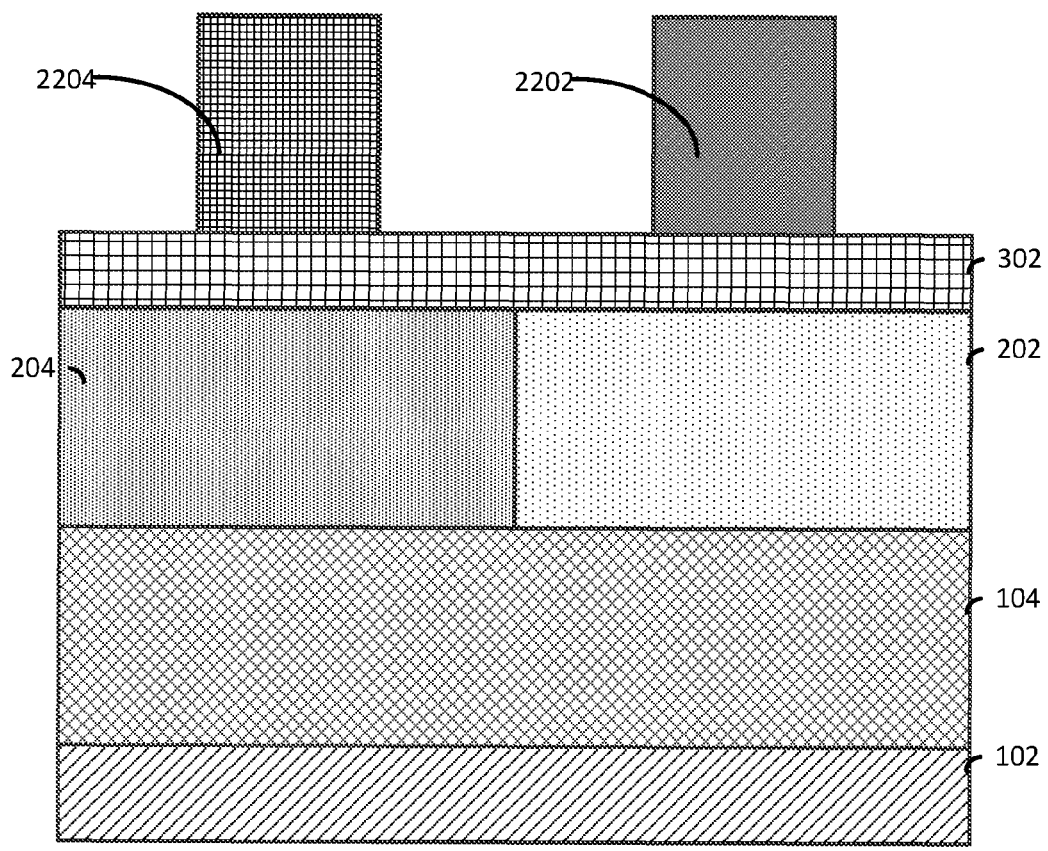
FIG. 22A illustrates a cut-away view along the line A-A (of FIG. 22B) following the patterning of sacrificial mandrels (mandrels)
Figure 22B:
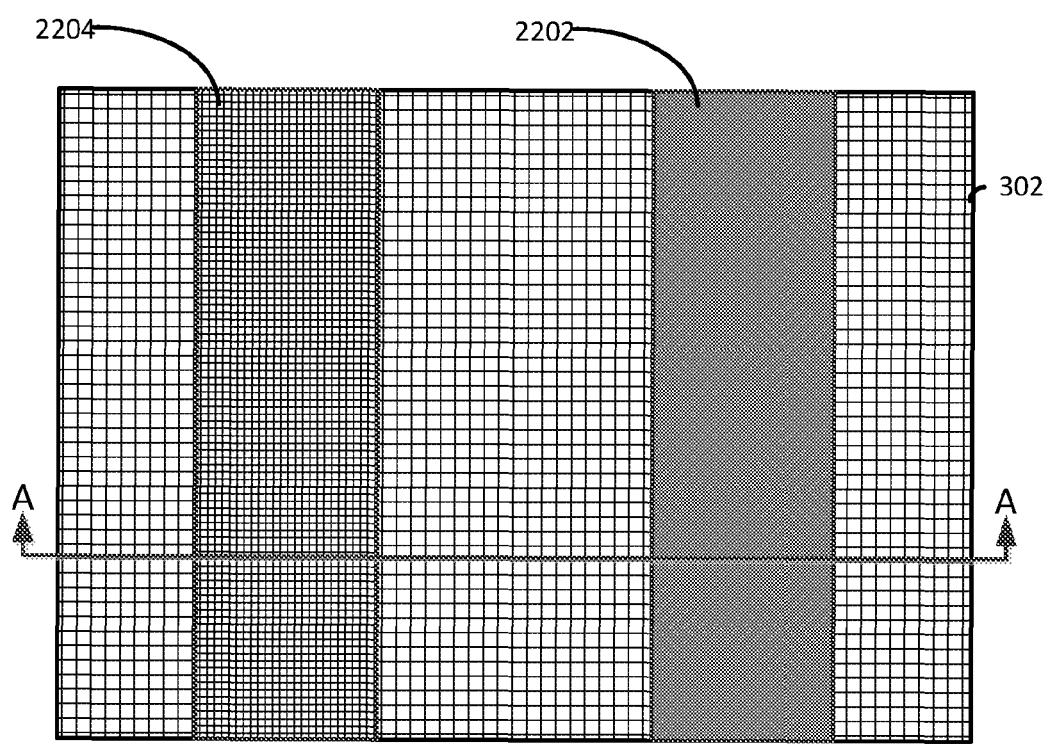
FIG. 22B illustrates a top view of the sacrificial mandrels.

FIG. 22A illustrates a cut-away view along the line A-A (of FIG. 22B) following the patterning of sacrificial mandrels (mandrels) 2202 and 2204. In this regard, a lithographic patterning and etching process is performed to remove portions of the semiconductor layer 402 and a doped semiconductor region 2102 to expose portions of the pad layer 302. The sacrificial mandrel 2202 is formed from the undoped semiconductor layer 402 and includes undoped semiconductor material. The sacrificial mandrel 2204 is formed from the doped semiconductor region 2102 and includes doped semiconductor material 2102. The sacrificial mandrels 2202 and 2204 may be formed from, for example, a reactive ion etching process. FIG. 22B illustrates a top view of the sacrificial mandrels 2202 and 2204.

Figure 23:
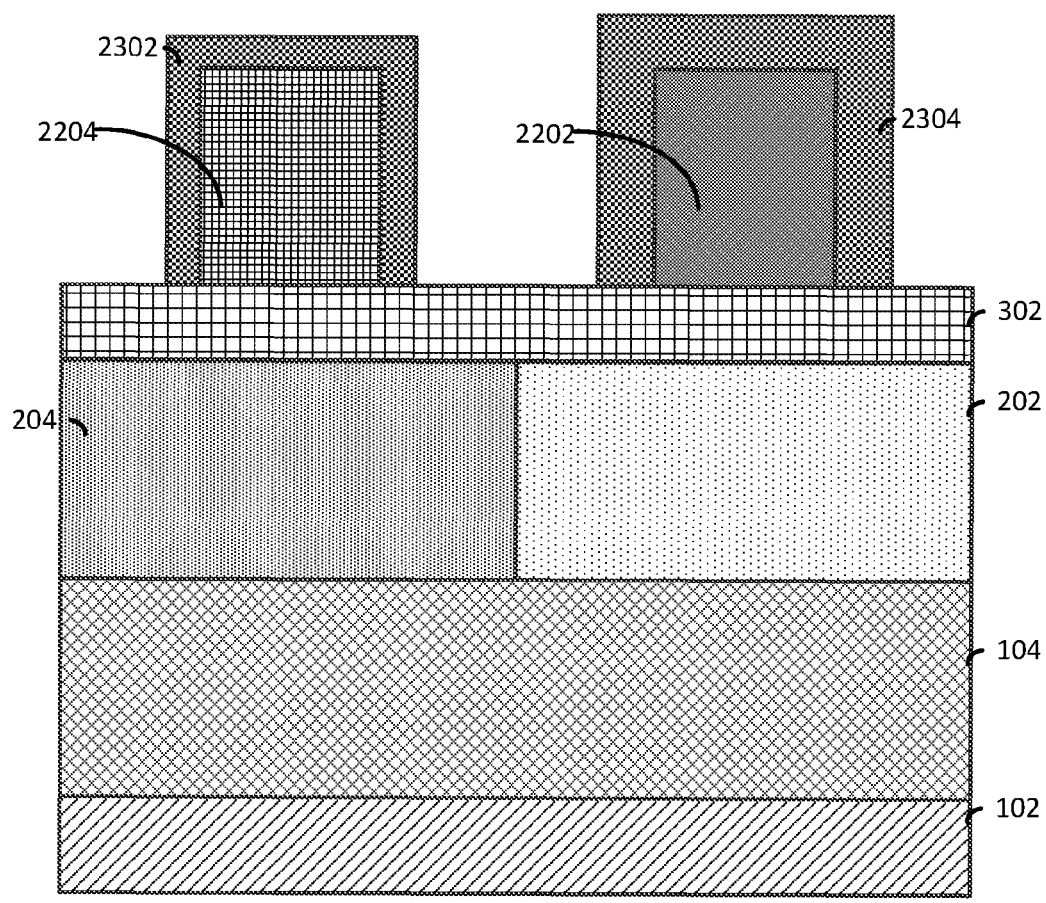

FIG. 23 illustrates a cut-away view following an oxide growth process that forms a layer of oxide 2302 on the sacrificial mandrel 2204 and a layer of oxide 2304 on the sacrificial mandrel 2202. In the illustrated exemplary embodiment, the oxide layer 2302 is thinner than the oxide layer 2304. The difference in thickness of the oxide layers 2302 and 2304 is a result of the dissimilar materials of the sacrificial mandrels 2202 and 2204. In this regard, the doped semiconductor mandrel 2204 oxidizes at a slower rate than the undoped semiconductor sacrificial mandrel 2202.

Figure 24:
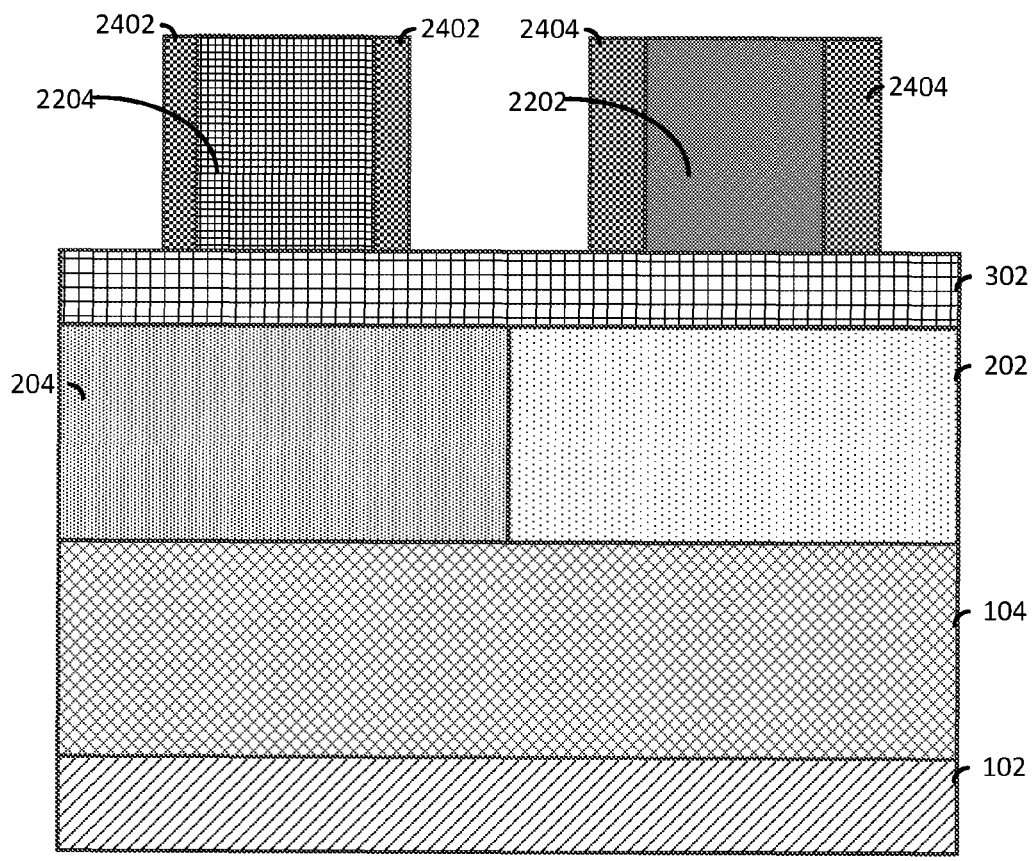

FIG. 24 illustrates a cut-away view following an anisotropic etching process that removes portions of the oxide layers 2302 and 2304 to expose portions of the mandrels 2204 and 2202. The resultant structure includes spacers 2402 and 2404 arranged along sidewalls of the mandrels 2204 and 2202. In the illustrated exemplary embodiment the spacers 2202 have shorter widths than the spacers 2204.

Figure 25:
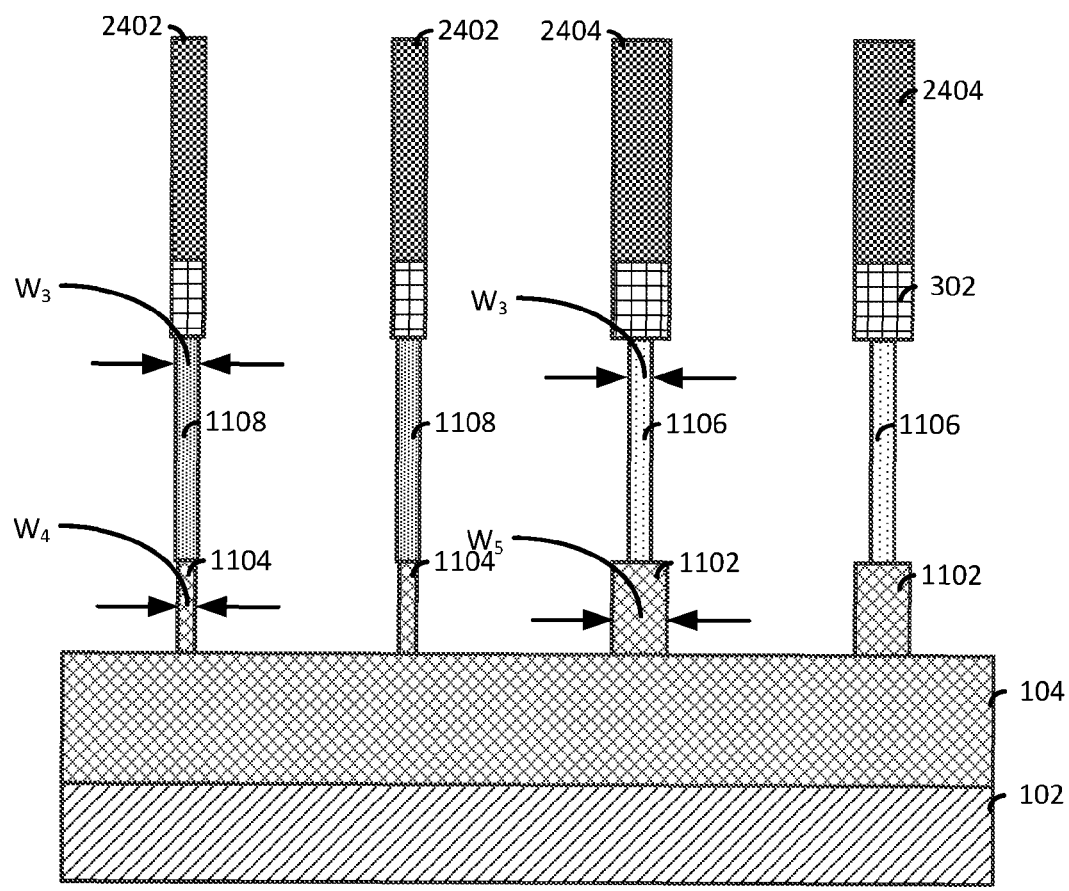

FIG. 25 illustrates a cut-away view similar to the view of FIG. 11A described above. Following the formation of the fins 1108 and 1106, similar processes as those described above in FIGS. 11B-19B may be used to form semiconductor devices.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a semiconductor device, the method comprising:
   forming a strain relaxation buffer layer on a substrate;
   forming a tensile strained layer on a first portion of the strain relaxation buffer layer and a compressive strained layer on a second portion of the strain relaxation buffer layer;
   forming a pad layer on the tensile strained layer and the compressive strained layer;
   forming a layer of semiconductor material on the pad layer;
   implanting ions in a portion of the layer of semiconductor material to form a doped portion of the layer of semiconductor material;
   removing portions of the layer of semiconductor material to form a first mandrel comprising the layer of semiconductor material, and a second mandrel comprising the doped portion of the layer of semiconductor material;
   forming spacers along sidewalls of the first mandrel and the second mandrel, the spacers along the sidewalls of the first mandrel having a width that is less than a width of the spacers formed along the sidewalls of the second mandrel;
   removing the first mandrel and the second mandrel to expose portions of the pad layer;
   removing exposed portions of the pad layer, the tensile strained layer and the compressive strained layer to form a first fin and a second fin; and
   forming a gate stack over a channel region of the first fin and a channel region of the second fin.

2. The method of claim 1, wherein the strain relaxation buffer layer includes silicon germanium.

3. The method of claim 1, wherein the tensile strained layer includes an epitaxially grown silicon material.

4. The method of claim 1, wherein the compressive strained layer includes an epitaxially grown silicon germanium material.

5. The method of claim 1, wherein the pad layer includes a nitride material.

6. The method of claim 1, wherein the layer of semiconductor material includes amorphous silicon.

7. The method of claim 1, wherein the implanting ions in a portion of the layer of semiconductor material includes:
   patterning a mask over the tensile strained layer; and implanting ions in the layer of semiconductor material over the compressive strained layer.

8. The method of claim 1, wherein the spacers are formed by:
   forming an oxide layer on the first mandrel and an oxide layer on the second mandrel, where the oxide layer on the second mandrel has a greater thickness than the oxide layer on the first mandrel; and
   removing portions of the oxide layer on the first mandrel to expose portions of the first mandrel, and removing portions of the oxide layer on the second mandrel to expose portions of the second mandrel.

9. The method of claim 1, wherein the first fin includes the tensile strained layer material and the second fin includes the compressive strained semiconductor material.

\* \* \* \* \*